(12) United States Patent
Yamahara et al.

(10) Patent No.: US 7,498,084 B2
(45) Date of Patent: Mar. 3, 2009

(54) MACROMOLECULAR STRUCTURE, FUNCTIONAL DEVICE HAVING THE SAME, TRANSISTOR, AND DISPLAY APPARATUS USING THE SAME

(75) Inventors: Motohiro Yamahara, Nara (JP); Masanobu Mizusaki, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 594 days.

(21) Appl. No.: 10/488,478

(22) PCT Filed: Aug. 29, 2002

(86) PCT No.: PCT/JP02/08768

§ 371 (c)(1),
(2), (4) Date: Mar. 1, 2004

(87) PCT Pub. No.: WO03/023876

PCT Pub. Date: Mar. 20, 2003

(65) Prior Publication Data

US 2004/0201018 A1    Oct. 14, 2004

(30) Foreign Application Priority Data

| Sep. 5, 2001 | (JP) | ............................. 2001-268626 |
| Sep. 18, 2001 | (JP) | ............................. 2001-282615 |

(51) Int. Cl.
*B32B 9/04* (2006.01)

(52) U.S. Cl. .................... 428/411.1; 977/754; 977/936; 977/937; 977/938; 438/99

(58) Field of Classification Search ................ 977/754, 977/936, 937, 938; 438/99
See application file for complete search history.

(56) References Cited

U.S. PATENT DOCUMENTS

| 5,247,190 | A | | 9/1993 | Friend et al. |
| 5,536,588 | A | | 7/1996 | Naito |
| 5,556,706 | A | | 9/1996 | Wakita et al. |
| 5,563,424 | A | | 10/1996 | Yang et al. |
| 5,705,826 | A | | 1/1998 | Aratani et al. |
| 6,025,462 | A | * | 2/2000 | Wang et al. ................ 528/377 |
| 6,962,758 | B2 | * | 11/2005 | Chen et al. ................ 428/690 |
| 2004/0132959 | A1 | * | 7/2004 | Kirchmeyer et al. ........ 528/373 |
| 2004/0201018 | A1 | * | 10/2004 | Yamahara et al. ............. 257/59 |
| 2005/0063175 | A1 | * | 3/2005 | Mizusaki et al. ............. 362/84 |
| 2005/0215760 | A1 | * | 9/2005 | Kirchmeyer et al. ........ 528/373 |
| 2006/0009614 | A1 | * | 1/2006 | Yamahara et al. ........... 528/380 |
| 2006/0102890 | A1 | * | 5/2006 | Yamahara et al. ............. 257/40 |
| 2006/0118901 | A1 | * | 6/2006 | Williams et al. ............ 257/485 |
| 2006/0180809 | A1 | * | 8/2006 | Park et al. ..................... 257/40 |

FOREIGN PATENT DOCUMENTS

| EP | 0 643 118 A1 | 3/1995 |
| JP | 63-076378 | 4/1988 |
| JP | 04-133351 | 5/1992 |
| JP | 05-110069 | 4/1993 |
| JP | 06-097479 | 4/1994 |
| JP | 06-158040 | 6/1994 |
| JP | 06-291312 | 10/1994 |
| JP | 2000-336171 | 12/2000 |
| WO | WO 99/55714 | 11/1999 |
| WO | WO 00/36660 | 6/2000 |

OTHER PUBLICATIONS

Tao et al, "Hyperbranched Polymer for Electroluminescence Applications", Advanced Materials, 10, No. 3 pp. 226-230, 1998.*
Serway, "Physics, For Scientists and Engineers" pp. 504-509, 1981 ed.*
Masaaki Kakimoto, Kagaku, vol. 50, pp. 608-612, 1995.
Masaaki Kakimoto, Kobunshi, Vo. 47, pp. 804-807, 1998.
Larry L. Miller et al., "Electrically Conducting Dendrimers", American Chemical Society, 119, pp. 1005-1010, 1997.
Yen-Yi Lin et al., "Pentacene-Based Organic Thin-film Transistors", IEEE Transactions on Electron Devices, vol. 44, No. 8, pp. 1325-1331, Aug. 1997.
Shirshendu K. Deb et al., "A Simple Orthogonal Approach to Poly(phenylenevinylene) Dendrimers", American Chemical Society, 119, pp. 9079-9080, 1997.
Masanobu Mizusaki et al.; "Organic EL Light Emitting Device and Liquid Crystal Display Using the Same", U.S. Appl. No. 10/500,653, filed Jul. 2, 2004.

* cited by examiner

*Primary Examiner*—Sheeba Ahmed
(74) *Attorney, Agent, or Firm*—Keating & Bennett, LLP

(57) ABSTRACT

A functional device includes a pair of electrodes 1 and 4 and a macromolecular structure including a hole-conducting layer 5 and an electron-conducting layer 2. The macromolecular structure includes a first hyperbranched macromolecule and a second hyperbranched macromolecule, at least one of the first hyperbranched macromolecule and the second hyperbranched macromolecule has a hole conductivity or an electron conductivity, one of the hole-conducting layer and the electron-conducting layer includes one of the first hyperbranched macromolecule and the second hyperbranched macromolecule, and the macromolecular structure has a self-assembled structure formed by a non-covalent interaction via the first hyperbranched macromolecule or the second hyperbranched macromolecule in at least one of the hole-conducting layer, the electron-conducting layer and the interface between the hole-conducting layer and the electron-conducting layer.

22 Claims, 7 Drawing Sheets

: DENDRITIC BRANCH STARTING POINT

FIRST GENERATION

SECOND GENERATION

THIRD GENERATION (a)

(b)

MACROMOLECULAR STRUCTURE, FUNCTIONAL DEVICE HAVING THE SAME, TRANSISTOR, AND DISPLAY APPARATUS USING THE SAME

BACKGROUND OF THE INVENTION

1. Field of the Invention

The present invention relates to a macromolecular structure including hyperbranched macromolecules having a hole conductivity or an electron conductivity, a functional device using the same, a transistor whose semiconductor layer includes organic macromolecules, and a display apparatus using the same.

2. Description of the Related Art

In recent years, active matrix liquid crystal display apparatuses using active devices such as thin film transistors (TFTs) have been used as monitors in notebook personal computers, desktop personal computers, workstations, etc., and as LCD televisions, etc., for their advantageous features such as providing image qualities as high as, or higher than, those of CRTs, consuming less power and taking up smaller spaces than CRTs. However, active matrix liquid crystal display apparatuses are more expensive than CRTs, and a further decrease in the price is called for so that active matrix liquid crystal display apparatuses can become widespread.

Active researches have been undertaken also for active matrix organic EL devices in which organic electroluminescence light-emitting devices (organic EL devices or OLEDs) are driven by using active devices, and a decrease in the price is called for also for active devices of organic EL devices.

As one approach to decrease the price, it has been proposed in the art to employ, as active devices, field effect transistors (organic FETs or organic TFTs) using an organic thin film semiconductor, which can advantageously be produced by a relatively simple method.

At present, a plasma chemical vapor deposition (CVD) apparatus for producing an insulating layer or a semiconductor layer of an amorphous silicon or polysilicon TFT and a sputtering apparatus used for forming electrodes thereof are expensive. Moreover, a CVD method uses a high deposition temperature of 230° C. to 350° C., and requires frequent maintenance such as cleaning, resulting in a low throughput. As compared with a CVD apparatus and a sputtering apparatus, an application apparatus, an inkjet apparatus, and the like, for producing an organic FET, etc., are less expensive, use lower deposition temperatures, and are easy to maintain. Therefore, a significant decrease in the cost can be expected when organic FETs are used in a display apparatus such as a liquid crystal display apparatus or an organic EL device.

A typical organic TFT includes a transparent substrate made of a glass, or the like, a gate electrode, a gate insulating layer, a drain electrode, a source electrode, and an organic semiconductor film. The gate voltage is changed to control the amount of charge at the interface between the gate insulating layer and the organic semiconductor film to be excessive or insufficient, thereby changing the level of the drain current flowing between the drain electrode and the source electrode, thus performing a switching operation.

Japanese Laid-Open Patent Publication No. 63-076378 discloses production of an organic TFT by using a film of polythiophene or a polythiophene derivative as the organic semiconductor film. Moreover, Yen-Yi Lin, David J. Gundlach, Shelby F. Nelson, and Thomas N. Jackson, IEEE Transaction on Electron Device, Vol. 44, No. 8 p. 1325 (1997) discloses production of an organic TFT by using pentacene.

In a case where pentacene is used, it is necessary to use a vapor deposition method, and it is thus necessary to improve the degree of crystallinity, etc., in order to improve the characteristics. It has also been studied in the art to use a pentacene derivative to provide solubility in order to improve the workability. However, sufficient characteristics have not been obtained.

Moreover, an organic semiconductor using polythiophene, a polythiophene derivative or a thiophene oligomer has a desirable formability and can easily be formed into a thin film by using an electrolytic polymerization method, a solution application method, or the like, and it has been researched in the art for practical applications. However, sufficient characteristics have not yet been obtained.

As described above, a conductive macromolecule (including a semiconductive macromolecule) has a desirable formability and can easily be formed into a thin film, and it has been researched in the art for its application to various functional devices such as a light-emitting device, a solar cell and a photoelectric conversion device, in addition to an organic FET device.

These functional devices have a semiconductor-semiconductor interface, a semiconductor-conductor interface, or the like, and their functions are exerted by, for example, carriers such as holes and electrons passing through these interfaces. It is important for such an interface that the opposing members are in close contact with each other across a large area. However, there are limits to increasing the interface area, and such an interface is often subject to a strong electric field or stress and is prone to degradation and peeling. This results in problems such as a decrease in durability due to interface degradation, and a decrease in response speed and output due to an insufficient interface area.

In view of this, U.S. Pat. No. 5,563,424 discloses a technique using a three-dimensional cocontinuous phase-separated structure of a polymer blend-type polymer alloy in order to increase the interface area. Moreover, Japanese Laid-Open Patent Publication No. 2000-286479 discloses a technique using a copolymerized-type polymer alloy, in which the interface durability is improved by forming a chemical bond at the interface.

Moreover, in recent years, hyperbranched macromolecules such as dendrimers and hyperbranched polymers have been attracting public attention. Dendrimers and hyperbranched polymers have characteristic features such as being amorphous, being soluble in organic solvents, and having many terminals to which functional groups can be introduced. In view of this, L. L. Miller, et al.; J. Am. Chem. Soc., 1997, 119, 1005 shows that a polyamide dendrimer having, at a branch terminal, a 1,4,5,8-naphthalenetetracarbonate diimide residue with quaternary pyridinium salt bound thereto has an isometric electron conductivity and that the conductivity is brought about by π-electron interaction due to spatial overlap between branch terminal structures. Moreover, Japanese Laid-Open Patent Publication No. 2000-336171 discloses a dendrimer and a photoelectric conversion device using the same, in which the dendrimer has a hole (positive hole)-conducting structure at a branch terminal, and the dendrimer is produced by using dendrons that do not include a π-electron conjugated system including a carbonyl group and a benzene ring.

Hereinafter, a conductive macromolecule that does not include a hyperbranched macromolecule, such as a conjugated macromolecule, will be referred to as a "conventional conductive macromolecule".

However, in a functional device using a conventional conductive macromolecule as described above, a high charge conductivity is exhibited in the direction in which the macromolecular chain is oriented, whereby it is influenced by the structure of the macromolecule.

Furthermore, many of the conventional conductive macromolecules are generally rigid and insoluble/non-meltable. In view of this, a polymer derivative or an oligomer to which a side chain is introduced for providing or improving meltability or solubility has been used (e.g., Japanese Laid-Open Patent Publication Nos. 4-133351, 63-76378, 5-110069, 7-126616, 8-18125 and 10-92576).

However, when a side chain is introduced, the flexibility of the macromolecular chain is increased, and the glass transition temperature is exhibited within the operating temperature range. As a result, thermochromism occurs due to micro-Brownian motion, and the π-electron conjugation length is shortened, thereby lowering the characteristics stability against temperature. The use of an oligomer results in problems such as a decrease in reliability. Moreover, with a system using an oligomer, sufficient mobilities have not been obtained, and it is necessary to increase the degree of polymerization, or to take measures such as to improve the alignment of the conductive organic compound by using an alignment film as described in Japanese Laid-Open Patent Publication No. 7-206599, etc. Furthermore, a conjugated macromolecule is easily influenced by oxygen or water, and is prone to degradation.

Moreover, in the device disclosed in Japanese Laid-Open Patent Publication No. 2000-336171, only the charge-conducting portion is formed by using a dendrimer, and the charge-generating portion is formed by using a conventional conductive macromolecule. Therefore, while the characteristics of the charge-conducting portion formed from a dendrimer is improved, characteristics such as interlayer energy movement and interlayer carrier movement are substantially the same as those of a device using a conventional conductive macromolecule, thus resulting in problems such as a poor durability and peeling at the interface.

As described above, sufficient characteristics have not been obtained with conventional organic functional devices such as organic FET devices, and they have problems such as a poor stability and a short operating lifetime.

The present invention, which has been made in view of the above, has an object to improve the characteristics and/or reliability of a functional device using a conductive macromolecule, and to provide a macromolecular structure that can suitably be used in such a functional device. Moreover, another object of the present invention is to provide a display apparatus using such an organic functional device.

SUMMARY OF THE INVENTION

A macromolecular structure of the present invention is a macromolecular structure, including a hole-conducting layer and an electron-conducting layer, wherein: the macromolecular structure includes a first hyperbranched macromolecule and a second hyperbranched macromolecule, at least one of the first hyperbranched macromolecule and the second hyperbranched macromolecule has a hole conductivity or an electron conductivity, and one of the hole-conducting layer and the electron-conducting layer includes one of the first hyperbranched macromolecule and the second hyperbranched macromolecule; and the macromolecular structure has a self-assembled structure formed by a non-covalent interaction via the first hyperbranched macromolecule or the second hyperbranched macromolecule in at least one of the hole-conducting layer, the electron-conducting layer and an interface between the hole-conducting layer and the electron-conducting layer. Thus, the object set forth above is achieved.

In a preferred embodiment, the first hyperbranched macromolecule has a hole conductivity, and the second hyperbranched macromolecule has an electron conductivity.

It is preferred that the hole-conducting layer includes a self-assembled structure formed by a plurality of first hyperbranched macromolecules, and the electron-conducting layer has a self-assembled structure formed by a plurality of second hyperbranched macromolecules.

It is preferred that the hole-conducting layer and the electron-conducting layer are layered on each other, and the macromolecular structure includes a self-assembled structure formed by a non-covalent interaction between the first hyperbranched macromolecule and the second hyperbranched macromolecule.

It is preferred that at least one of the hole-conducting layer and the electron-conducting layer has isotropic characteristics, and it is more preferred that both of them have isotropic characteristics. "Isotropic characteristics" as used herein mean that there is substantially no characteristics difference between the core structures of a plurality of hyperbranched macromolecules (of the same kind or of different kinds) or between the branch structures thereof.

It is preferred that at least one of the first hyperbranched macromolecule and the second hyperbranched macromolecule is a dendrimer, and it is more preferred that they are both dendrimers.

At least one of the first hyperbranched macromolecule and the second hyperbranched macromolecule may have two or more different functions. The two functions are, for example, a fluorescence property and an electron conductivity.

The macromolecular structure in one embodiment further includes a third hyperbranched macromolecule between the first hyperbranched macromolecule and the second hyperbranched macromolecule, wherein a self-assembled structure is formed by a non-covalent interaction between the third hyperbranched macromolecule and the first hyperbranched macromolecule or the second hyperbranched macromolecule.

The first hyperbranched macromolecule may have a hole conductivity, the second hyperbranched macromolecule may have an electron conductivity, and the third hyperbranched macromolecule may have one of a hole conductivity, an electron conductivity and an ion conductivity.

The hole-conducting layer may include a self-assembled structure formed by a plurality of first hyperbranched macromolecules, the electron-conducting layer may include a self-assembled structure formed by a plurality of second hyperbranched macromolecules, and the macromolecular structure may include a further functional layer including a self-assembled structure formed by a plurality of third hyperbranched macromolecules between the hole-conducting layer and the electron-conducting layer.

It is preferred that the hole-conducting layer, the electron-conducting layer and the further functional layer are layered on one another, and the macromolecular structure includes at least one of a self-assembled structure formed by a non-covalent interaction between the first hyperbranched macromolecule and the third hyperbranched macromolecule and a self-assembled structure formed by a non-covalent interaction between the second hyperbranched macromolecule and the third hyperbranched macromolecule, and it is more preferred that the macromolecular structure includes both of the self-assembled structures.

It is preferred that at least one of the hole-conducting layer, the electron-conducting layer and the further functional layer has isotropic characteristics, and it is more preferred that they all have isotropic characteristics.

It is preferred that at least one of the first hyperbranched macromolecule, the second hyperbranched macromolecule and the third hyperbranched macromolecule is a dendrimer, and it is more preferred that they are all dendrimers.

At least one of the first hyperbranched macromolecule, the second hyperbranched macromolecule and the third hyperbranched macromolecule may have two or more different functions.

A functional device of the present invention includes one of the macromolecular structures described above, and an electrode electrically connected to the macromolecular structure. Thus, the object set forth above is achieved.

A transistor of the present invention includes a first electrode, a second electrode, a semiconductor layer provided between the first electrode and the second electrode, and a third electrode for applying an electric field across the semiconductor layer, wherein the semiconductor layer includes a hyperbranched macromolecule and has a self-assembled structure formed by a non-covalent interaction via the hyperbranched macromolecule. Thus, the object set forth above is achieved.

It is preferred that the semiconductor layer has an isotropic conductivity.

It is preferred that the hyperbranched macromolecule has a spherical or disc-shaped stereostructure.

It is preferred that the hyperbranched macromolecule is a dendrimer.

In a preferred embodiment, the transistor of the present invention is a field effect transistor that utilizes an electric field effect of the semiconductor layer in response to an electric field applied by the third electrode.

A display apparatus of the present invention includes a plurality of pixels and a plurality of active devices corresponding respectively to the plurality of pixels, wherein each of the plurality of active devices is the transistor described above.

DETAILED DESCRIPTION OF PREFERRED EMBODIMENTS

Embodiments of the present invention will now be described.

Figure 1:
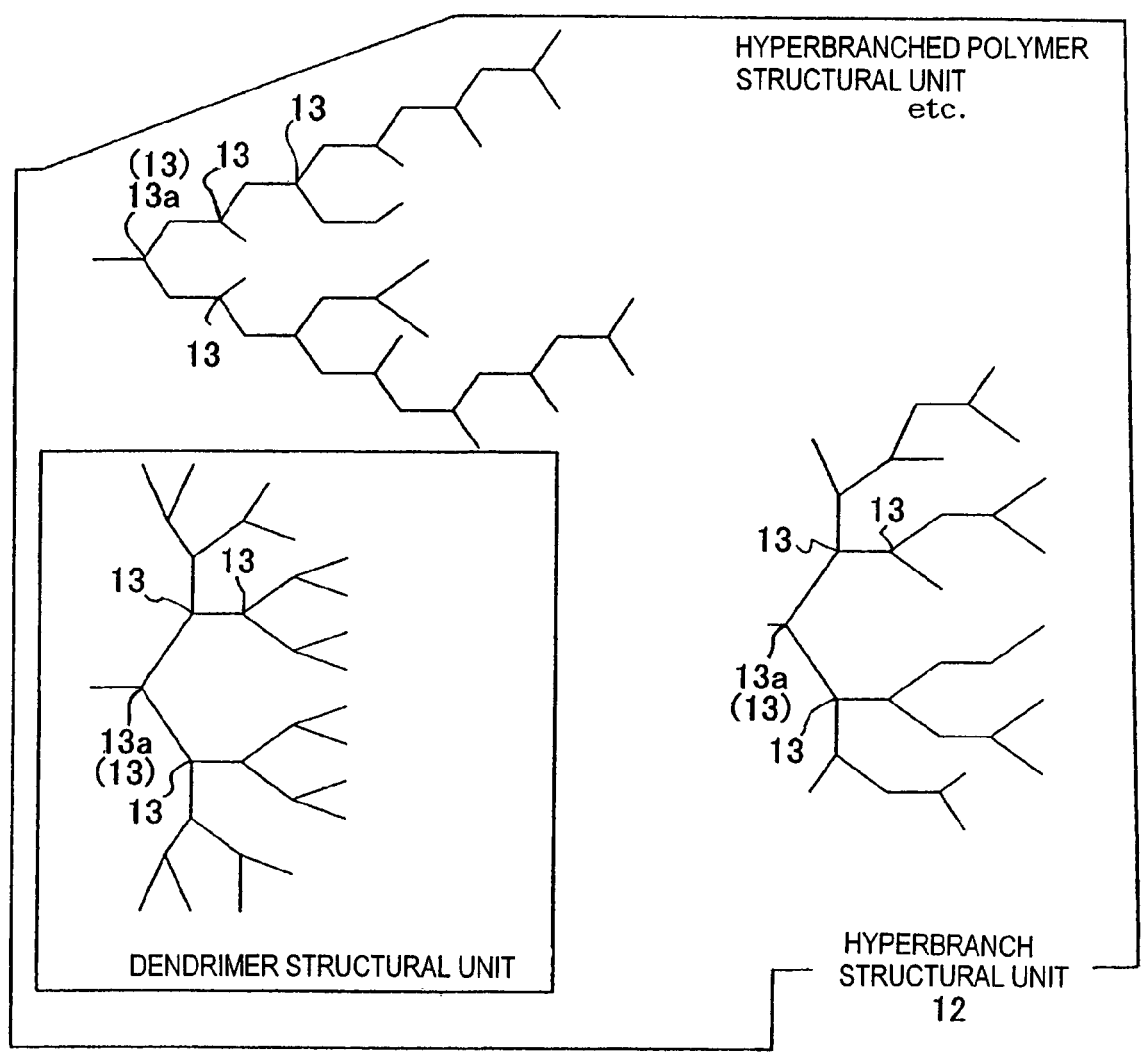
FIG. 1 is a conceptual diagram schematically illustrating the structure and classification of hyperbranched macromolecules.

A hyperbranched macromolecule as used herein refers to a macromolecule including at least one hyperbranched structural unit having a branch structure of an arbitrary shape. A "hyperbranched structural unit" as used herein includes a dendrimer structural unit or a hyperbranched polymer structural unit, as schematically illustrated in FIG. 1. Description on dendrimers and hyperbranched polymers can be found in, for example, Masaaki Kakimoto, Kagaku, Vol. 50, p. 608 (1995), and Kobunshi, Vol. 47, p. 804 (1998).

A hyperbranched structural unit 12 includes one dendritic branch starting point 13a. The number of branch points 13 included in the hyperbranched structural unit 12 is not limited to any particular number, and the dendritic branch starting point 13a may be the only branch point 13. The hyperbranched structural unit 12 may have regularly-repeating branch structures as in a dendrimer structural unit, or irregularly-repeating branch structures as in a hyperbranched polymer structural unit.

Figure 2:
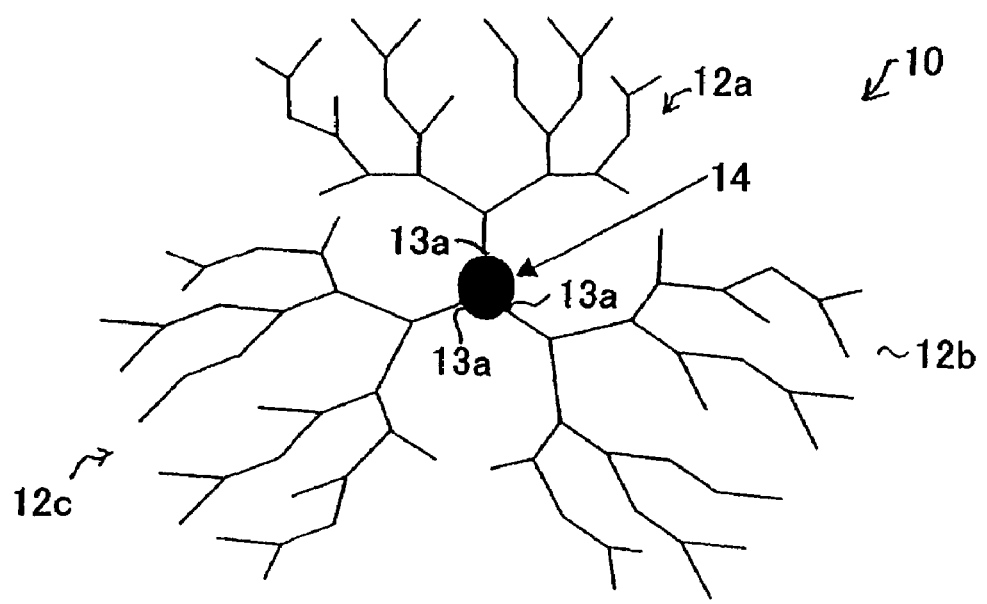
FIG. 2 is a diagram schematically illustrating the structure of a hyperbranched macromolecule used in the present invention.
Figure 3:
FIG. 3 is a schematic diagram illustrating the concept of the number of generations of a dendrimer.
Figure 3:
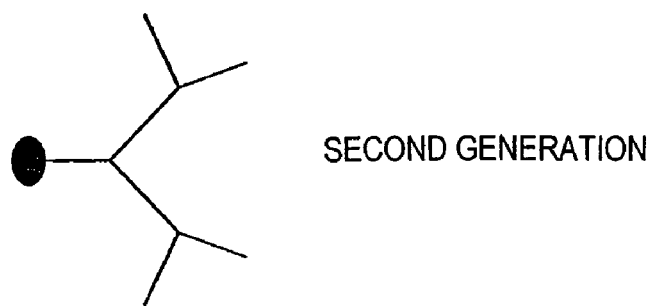
Figure 3:
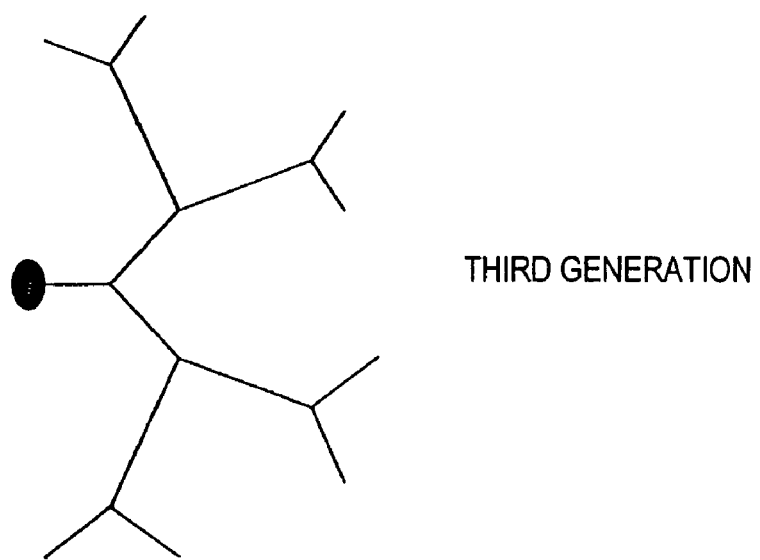

While a hyperbranched macromolecule as used herein may include at least one hyperbranched structural unit 12 illustrated in FIG. 1, it is preferred that it includes a plurality of hyperbranched structural units 12 (12a to 12c) bound to a core structure (core) 14, as in a hyperbranched macromolecule 10 illustrated in FIG. 2. Particularly, it is preferred that the macromolecular structure of the hyperbranched macromolecule 10 has a high degree of symmetry and the number of hyperbranched structural units 12 is three or four so that the hyperbranched macromolecule 10 and the self-assembled structure of the hyperbranched macromolecules 10 exhibit isotropic characteristics. While the plurality of hyperbranched structural units 12 may be different from one another, they are preferably the same in view of the symmetry of the structure.

The hyperbranched macromolecule 10 illustrated in FIG. 2 has a structure in which the dendritic branch starting points 13a of the three hyperbranched structural units 12a, 12b and 12c are bound to a trifunctional atomic group as the core structure 14. While the bond between the core structure 14 and the hyperbranched structural unit 12 is typically a covalent bond, it may alternatively be a non-covalent bond such as a hydrogen bond or a coordinate bond.

The hyperbranched structural units 12a, 12b and 12c may be different from one another or may be the same. It is preferred that the three hyperbranched structural units 12a, 12b and 12c are the same so that the hyperbranched macromolecule 10 has isotropic characteristics. Hereinafter, the polyfunctional atomic group as the core structure 14 will also be denoted by the reference numeral 14.

Note that the hyperbranched macromolecule 10 used in the present invention may have a hole conductivity, an electron conductivity or an ion conductivity at the molecular surface thereof, may have an energy interaction between the molecular surface and the inside, or may have a carrier conductivity in the dendron (the repeating unit in the hyperbranched structural unit). In the hyperbranched macromolecule 10 having a carrier conductivity at the molecular surface thereof, carriers move through hopping between terminal groups having a carrier conductivity. In a case where a dendron has a carrier conductivity, e.g., where a dendron has a structure with π-electrons such as a π-conjugated chain, carriers can also move between the core structure 14 and the hyperbranched structural unit 12. Thus, the function of the core structure 14 can be drawn out.

The core structure 14 of the hyperbranched macromolecule 10 refers to a portion of the hyperbranched macromolecule 10 excluding the hyperbranched structural units 12 starting from the dendritic branch starting point 13a, the portion being capable of binding to an arbitrary number of the dendritic branch starting points 13a. The hyperbranched macromolecule 10 suitably used in the present invention typically includes a plurality of hyperbranched structural units 12 around the core structure 14 and has a highly symmetric stereostructure, whereby the core structure 14 is located at the center of the stereostructure of the hyperbranched macromolecule 10.

The polyfunctional atomic group 14 forming the core structure 14 may be: (1) an alkylene group whose carbon number is 1 to 20, which may include a hetero atom such as O, NH, N(CH$_3$), S or SO$_2$, and which is unsubstituted or substituted with a hydroxyl group, a carboxyl group, an acyl group or a halogen atom such as a fluorine atom, a chlorine atom, a bromine atom or an iodine atom; (2) an arylene group whose carbon number is 6 to 20; (3) a group in which the alkylene group and the arylene group are bound to each other; (4) a polyvalent group similar to one of the groups (1) to (3) above in which a hydrogen atom bound to a carbon atom is eliminated; (5) a polyvalent heterocyclic group; (6) a group in which a polyvalent heterocyclic group and a hydrocarbon group of one of the groups (1) to (4) above are bound to each other; or (7) porphyrin or a porphyrin complex.

The dendron of the hyperbranched macromolecule 10 used in the present invention may be aromatic or aliphatic. Specifically, it may be a macromolecular structure such as an aromatic or aliphatic polyether structure, an aromatic polyester structure, a polysiloxane structure, a polycarbosilane structure, a polyetheramide structure, a polyamideamine structure or a polypropyleneimine structure, or a conjugated macromolecule structure such as polyphenylene, polyphenylenevinylene or polyphenyleneethynylene, and it may include a heterocyclic group such as polythiophene, polythienylenevinylene, polypyrrole or polysilole, or the like.

In order to give the dendron a carrier conductivity, the dendron may be provided with a π-conjugated structure. Alternatively, it may be provided with a structure with a dialkylphenylamine residue, a structure with a triphenylamine residue, a phenanthroline residue, an imidazole residue, or the like, as a hole-conducting structure. Alternatively, it may be provided with a naphthalenetetracarbonate diimide residue, or the like, as an electron-conducting structure. Alternatively, it may be provided with a salt containing an anion such as a carboxylate or sulfonate functional group and a cation such as an alkali metal or an alkaline-earth metal, as an ion-conducting structure.

Moreover, an atomic group (functional group) exhibiting a function other than a carrier conductivity may be introduced into a hyperbranched macromolecule so as to incorporate a combination of different functions. For example, a group having a fluorescence property, a group having a UV-absorbing property, or the like, may be introduced into the molecule. Specifically, the core structure of the dendrimer may be provided with a rhodamine dye, for example.

As described above, with the hyperbranched macromolecule 10 used in the present invention, the branched structure thereof is not limited to any particular structure as long as it has the hyperbranched structural unit 12. Nevertheless, it is preferably a dendrimer in view of the symmetry of the macromolecular structure. In a case where the hyperbranched macromolecule 10 is a dendrimer, the number of generations thereof is not limited to any particular number of generations. The number of generations is typically 1 to 10, including those having large or long core structures 14. In view of the density of terminal groups (terminal portions of the hyperbranched structural unit 12, terminal portions forming the surface of the hyperbranched macromolecule 10) and the ease of synthesis, the number of generations is preferably 2 to 8, more preferably 3 to 7, and most preferably 3 to 5. Note that the generation of a dendrimer represents how many times it has gone through the regular branching.

A macromolecular structure of the present invention includes a hole-conducting layer and an electron-conducting layer, and includes a first hyperbranched macromolecule and a second hyperbranched macromolecule. At least one of the first hyperbranched macromolecule and the second hyperbranched macromolecule has a hole conductivity or an electron conductivity. One of the hole-conducting layer and the electron-conducting layer includes one of the first hyperbranched macromolecule and the second hyperbranched macromolecule, and the macromolecular structure has a self-assembled structure formed by a non-covalent interaction via the first hyperbranched macromolecule or the second hyperbranched macromolecule in at least one of the hole-conducting layer, the electron-conducting layer, and the interface between the hole-conducting layer and the electron-conducting layer.

Thus, the macromolecular structure of the present invention includes a self-assembled structure formed by a non-covalent interaction via the hyperbranched macromolecule described above. The self-assembled structure may be formed between hyperbranched macromolecules of the same kind or between hyperbranched macromolecules of different kinds. Moreover, in a case where the macromolecular structure includes a conventional chain macromolecule, it may be a self-assembled structure formed between a hyperbranched macromolecule and the conventional chain macromolecule. In a case where a hyperbranched macromolecule is used, the smallest possible self-assembled structure may be formed by two hyperbranched macromolecules (two molecules).

One of the at least two hyperbranched macromolecules in the macromolecular structure of the present invention has a hole conductivity or an electron conductivity, and one of the hole-conducting layer and the electron-conducting layer of the macromolecular structure includes the one of the hyperbranched macromolecules. For example, in a case where the first hyperbranched macromolecule has a hole conductivity and the second hyperbranched macromolecule has an electron conductivity, the hole-conducting layer includes the first hyperbranched macromolecule and the electron-conducting layer includes the second hyperbranched macromolecule. The self-assembled structure may be formed in the hole-conducting layer by the interaction between the first hyperbranched macromolecules, may be formed in the electron-conducting layer by the interaction between the second hyperbranched macromolecules, or may be formed at the interface between the hole-conducting layer and the electron-conducting layer by the interaction between the first hyperbranched macromolecule and the second hyperbranched macromolecule. It is preferred that the hole-conducting layer, the electron-conducting layer and the interface therebetween (interface region) all include the self-assembled structure.

Moreover, a semiconductor layer of a transistor of the present invention includes a hyperbranched macromolecule, and has a self-assembled structure formed by a non-covalent interaction via the hyperbranched macromolecule. The self-assembled structure may be formed between hyperbranched macromolecules of the same kind or between hyperbranched macromolecules of different kinds. Moreover, in a case where the semiconductor layer includes a conventional chain macromolecule, it may be a self-assembled structure formed between the hyperbranched macromolecule and the conventional chain macromolecule. In a case where a hyperbranched macromolecule is used, the smallest possible self-assembled structure may be formed by two hyperbranched macromolecules (two molecules).

Note that the non-covalent interaction includes a van der Waals force, a hydrogen bond, an electrostatic interaction, a π-electron interaction, a charge movement interaction, and the like.

Now, the self-assembled structure of the macromolecular structure and the semiconductor layer of the present invention will be described with reference to FIG. 4(a) and FIG. 4(b).

Figure 4:
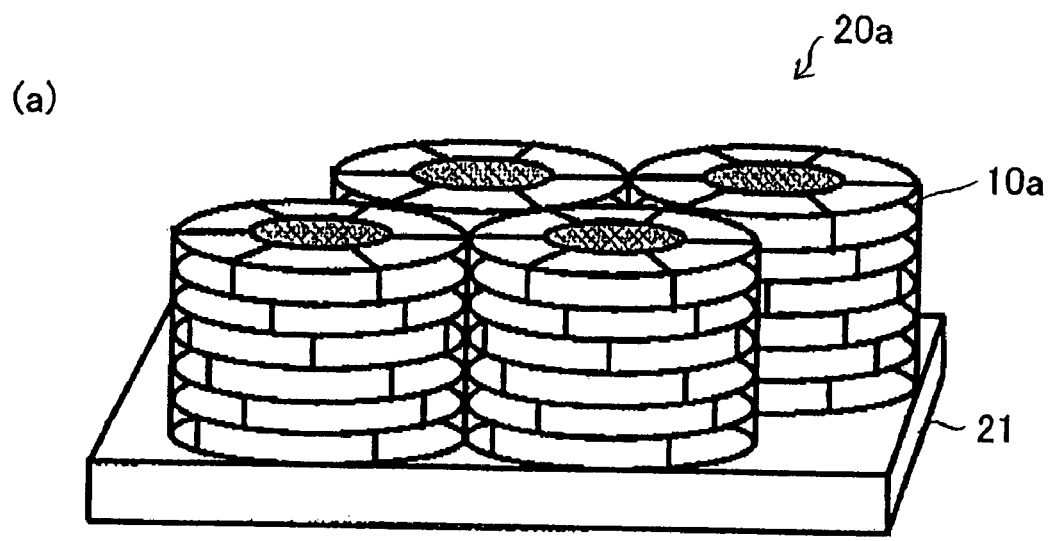
FIG. 4(a) and FIG. 4(b) are schematic diagrams each illustrating an example of a self-assembled structure formed by hyperbranched macromolecules of the present invention.
Figure 4:
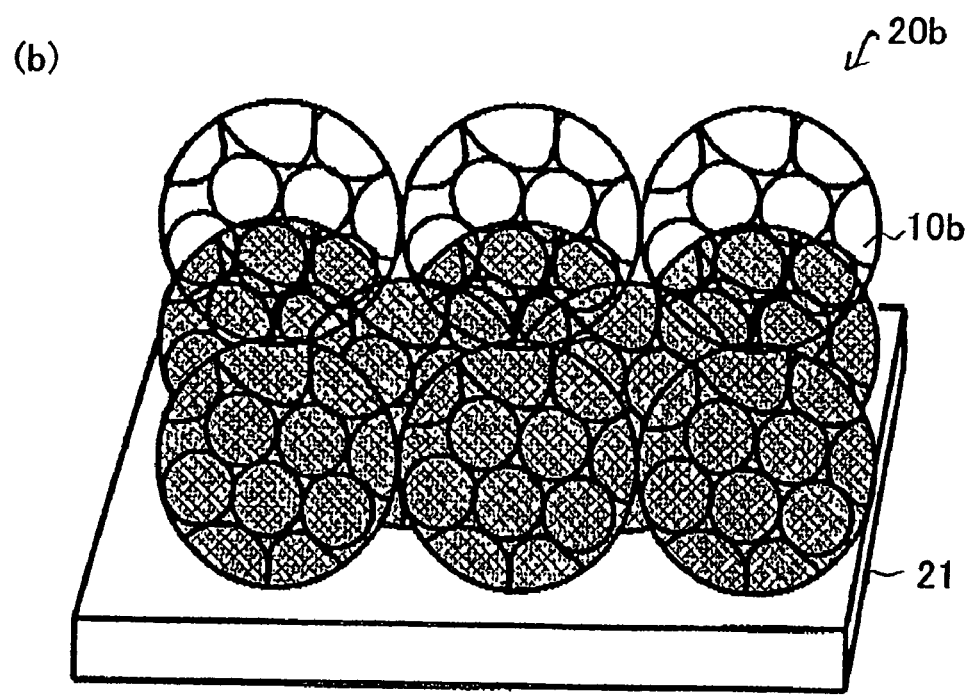

It is preferred that the stereostructure of the hyperbranched macromolecule used in the present invention is a disc-shaped structure as illustrated in FIG. 4(a) or a spherical structure as illustrated in FIG. 4(b) so that it exhibits isotropic characteristics. Note that a hyperbranched macromolecule having such a stereostructure can be obtained by appropriately adjusting the structure of the core structure, the structure of the dendron and the number of generations of the dendron, as described above.

Disc-shaped hyperbranched macromolecules 10a form a self-assembled structure 20a by a non-covalent interaction between the molecules, as illustrated in FIG. 4(a). Spherical hyperbranched macromolecules 10b form a self-assembled structure 20b by a non-covalent interaction between the molecules, as illustrated in FIG. 4(b). While FIG. 4(b) shows the self-assembled structure 20b in which one hyperbranched macromolecule 10b of the second layer is located at the center of four hyperbranched macromolecules 10b of the first layer, the self-assembled structure is not limited to this, and it may alternatively be a self-assembled structure in which hyperbranched macromolecules 10b of the first layer and those of the second layer are stacked on each other.

In FIG. 4(a) and FIG. 4(b), the hyperbranched macromolecules 10a and 10b stacked on each other may be of the same kind or of different kinds. Thus, a plurality of layers of hyperbranched macromolecules of the same kind may form one functional layer (e.g., a hole-conducting layer), or a monomolecular layer of hyperbranched macromolecules may form one functional layer. Therefore, the self-assembled structures 20a and 20b illustrated in FIG. 4(a) and FIG. 4(b) may form a single functional layer or a layered structure of a plurality of functional layers.

Thus, by forming a self-assembled structure by a non-covalent interaction, energies or carriers generated in a layer can smoothly move in the layer and/or between layers via a portion where there is a strong non-covalent interaction, whereby it is possible to increase the movement velocity.

Moreover, since hyperbranched macromolecules having a three-dimensional extent and/or a self-assembled structure thereof are responsible for a function such as providing a conductivity, it is possible to suppress the temperature dependence of the characteristics as in a conventional conductive macromolecule in which a one-dimensional conjugated chain is responsible for such a function.

A wide variety of deposition methods known in the art can be applied to the formation of a functional layer such as a hole-conducting layer or an electron-conducting layer by using hyperbranched macromolecules. A hyperbranched macromolecule, having a desirable solubility in a solvent as compared with a conventional conjugated conductive macromolecule, can be prepared in the form of a solution by using various solvents. A film of hyperbranched macromolecules can be formed by applying or printing the solution on a substrate (supporting member) 21 by using a spin coating method, a dip coating method, a casting method, a printing method, an inkjet method, or the like, drying the solution, and then subjecting it to a heat treatment as necessary.

For example, a monomolecular film of hyperbranched macromolecules can be formed by dipping the substrate 21 in a solution of a predetermined concentration for a predetermined amount of time. If hyperbranched macromolecules and a layer that exhibits a non-covalent interaction are formed in advance on the substrate surface, a monomolecular layer is formed while forming a self-assembled structure.

Thus, it is possible to form the macromolecular structure of the present invention or the semiconductor layer used in the transistor of the present invention by successively forming films of hyperbranched macromolecules on the substrate 21.

Moreover, since a hyperbranched macromolecule can be melted at lower temperatures than a conventional conjugated conductive macromolecule, or the like, it can be shaped into various shapes by a hot pressing method, an injection molding method, a transfer molding method, or the like. The macromolecular structure of the present invention can be obtained by layering the obtained layers of hyperbranched macromolecules on one another.

In FIG. 4(a) and FIG. 4(b), a self-assembled structure formed by a non-covalent interaction between hyperbranched macromolecules has been described. Alternatively, a self-assembled structure can be formed by a non-covalent interaction between a hyperbranched macromolecule and a conventional chain macromolecule. For example, the hole-conducting layer can be formed by the first hyperbranched macromolecules while forming the electron-conducting layer by the conventional conductive macromolecules (conjugated chain macromolecules), and the self-assembled structure can be formed by a non-covalent interaction therebetween.

Macromolecules other than hyperbranched macromolecules may include, for example, those obtained by introducing a side chain such as a phthalocyanine-based derivative, an azo compound-based derivative, a perylene-based derivative, a quinacridone-based derivative, a polycyclic quinine-based derivative, a cyanin-based derivative, a fullerene derivative, a derivative of a nitrogen-containing cyclic compound such as indole or carbazole, a hydrazone derivative, a triphenylamine derivative or a polycyclic aromatic compound derivative to a main chain such as a polystyrene chain, a polysiloxane chain, a polyether chain, a polyester chain, a polyamide chain or a polyimide chain. Moreover, such macromolecules other than hyperbranched macromolecules may also include: conjugated macromolecule chains (a carbon-type conjugated macromolecule: an aromatic conjugated macromolecule such as polyparaphenylene, an aliphatic conjugated macromolecule such as polyacetylene, a heterocyclic conjugated macromolecule such as polypyrrole and polythiophene, a hetero atom-containing conjugated macromolecule such as polyanilines, polyphenylenesulfide; a combined conjugated macromolecule, in which structural units of the above conjugated macromolecules (e.g., poly(phenylenevinylene), poly(arylenevinylene) or poly(thienylenevinylene)), are alternately connected together; and the like); polysilanes; disilanylene polymers; and a disilanylene-carbon-based conjugated polymer structure.

Moreover, while the macromolecular structure of the present invention typically has a layered structure as described above, it does not need to have a layered structure. The first hyperbranched macromolecule and the second hyperbranched macromolecule may be mixed together so that self-assembled structures are formed by a non-covalent interaction therebetween, and the formed self-assembled structures may be mixed and dispersed in a macromolecular matrix. Moreover, in a case where the concentration of the hyperbranched macromolecule in the macromolecular matrix is sufficiently high, the hole-conducting layer can be formed by using a composition obtained by dispersing hole-conducting hyperbranched macromolecules in an insulative macromolecular matrix, for example. In such a case, self-assembled structures may be formed not only by a non-covalent interaction between the hyperbranched macromolecules dispersed in the macromolecular matrix, but also between the hole-conducting layer and the adjacent electron-conducting layer. The electron-conducting layer may also be formed from a composition obtained by dispersing hyperbranched macromolecules in a macromolecular matrix.

The material of the macromolecular matrix is not limited to any particular material as long as it does not hinder the formation of self-assembled structures. For example, the material may be a polycarbonate made of 2,2-bis(4-hydroxyphenyl)propane (commonly known as "bisphenol A"), a polycarbonate made of 2,2-bis(3-methyl-4-hydroxyphenyl)propane (commonly known as "bisphenol C"), a polycarbonate made of bis(4-hydroxyphenyl)phenylmethane (commonly known as "bisphenol P"), a polycarbonate made of 1,1-bis(4-hydroxyphenyl)cyclohexane (commonly known as "bisphenol Z"), or a thermoplastic or thermosetting resin such as an aromatic polycarbonate resin, a polyarylate resin, an acrylic resin, a styrene-based resin, polyvinyl chloride, a vinyl chloride-vinyl acetate copolymer, polyvinyl acetate, polyvinylidene chloride, a phenoxy resin, an epoxy resin, or a phenol resin.

In a case where hyperbranched macromolecules are dispersed in a macromolecular matrix, the content of the hyperbranched macromolecules is equal to or greater than 40 wt % and less than 100 wt %, and preferably equal to or greater than 60 wt % and less than 100 wt %.

The method for preparing such a hyperbranched macromolecule-dispersed composition is not limited to any particular method. For example, it can be prepared by using various solvents. Suitable solvents include tetrahydrofuran (THF), 1,4-dioxane, cyclohexanone, toluene, chlorobenzene, methyl ethyl ketone (MEK), acetone, N,N-dimethyl formaldehyde (DMF) and methylene chloride. The obtained solution can be applied or printed by using a method such as a spin coating method a dip coating method, a casting method, a printing method or an inkjet method, dried, and then subjected to a heat treatment as necessary, to obtain a film of a hyperbranched macromolecule-dispersed composition.

An additive such as a dopant may be added to a hyperbranched macromolecule solution or a solution of a hyperbranched macromolecule-containing composition. For example, the additive may be a styryl dye (DCM), an n-type or p-type dopant, or the like. Any of various additives may be used according to the type and function of the hyperbranched macromolecule. Particularly, since a hyperbranched macromolecule can exhibit a plurality of functions by introducing a group having a fluorescence property or a group having a UV-absorbing property into the molecule, it is possible to improve the characteristics and to incorporate further functions by using such an additive.

Various functional devices can be obtained by providing electrodes for voltage application to the macromolecular structure of the present invention. For example, the macromolecular structure of the present invention can be used in a solar cell, a photoelectric conversion device, an organic FET device, a condenser, a light-emitting device, an electrochromic device, a polymer secondary cell, etc. Device structures suitable for different applications will now be described in detail.

In a photoelectric conversion device or a solar cell, the macromolecular structure is typically sandwiched between a pair of parallel-plate electrodes. However, the present invention is not limited thereto, and the macromolecular structure may alternatively be formed on a comb-shaped electrode. The material of the electrode is not limited to any particular material. In a case where parallel-plate electrodes are used, it is preferred that at least one of the electrodes is a transparent electrode such as an ITO electrode or an electrode made of fluorine-doped tin oxide. Moreover, the macromolecular structure is formed from p-type semiconductive or hole-conducting hyperbranched macromolecules and n-type semiconductive or electron-conducting hyperbranched macromolecules. Moreover, further improvements can be obtained by introducing a photosensitizing dye group to the hyperbranched macromolecule of one of the two layers described above, or by introducing, between the two layers, a macromolecule or a hyperbranched macromolecule in which a photosensitizing dye molecular structure whose HOMO (highest occupied molecular orbital) level is lower than that of a hole-conducting hyperbranched macromolecule and whose LUMO (lowest unoccupied molecular orbital) level is higher than that of an electron-conducting hyperbranched macromolecule is introduced. Then, in a case where it is used as a solar cell, power can be generated at a high efficiency.

Furthermore, an electrochemical photoelectric conversion device can be obtained by providing an oxidizable/reducible ion-conducting hyperbranched macromolecule or ion-conducting macromolecule between the p-type semiconductive or hole-conducting hyperbranched macromolecule and the n-type semiconductive or electron-conducting hyperbranched macromolecule. Then, in a case where the p-type semiconductive or hole-conducting hyperbranched macromolecule is optically excited, the oxidation-reduction priority of the ion-conducting hyperbranched macromolecule or ion-conducting macromolecule is preferably higher than the LUMO of the p-type semiconductive or hole-conducting hyperbranched macromolecule and lower than the LUMO of the n-type semiconductive or electron-conducting hyperbranched macromolecule. On the other hand, in a case where the n-type semiconductive or electron-conducting hyperbranched macromolecule is optically excited, it is preferably higher than the HOMO of the p-type semiconductive or hole-conducting hyperbranched macromolecule and lower than the HOMO of the n-type semiconductive or electron-conducting hyperbranched macromolecule. Moreover, in a case where the p-type semiconductive or hole-conducting hyperbranched macromolecule and the n-type semiconductive or electron-conducting hyperbranched macromolecule are both optically excited, it is preferably higher than the LUMO of the p-type semiconductive or hole-conducting hyperbranched macromolecule and lower than the HOMO of the n-type semiconductive or electron-conducting hyperbranched macromolecule. Moreover, a photosensitizing dye group may be introduced to any of the layers as necessary.

For a macromolecular structure having a three-layer structure, at least two layers are formed from hyperbranched macromolecules. Preferably, two adjacent layers are formed from hyperbranched macromolecules, and more preferably, the three layers are all formed from hyperbranched macromolecules. The characteristics and the reliability can be improved by forming a self-assembled structure in each layer or between layers.

Also for a light-emitting device, the macromolecular structure of the present invention is, in many cases, sandwiched between parallel-plate electrodes. The structures of typical functional devices will now be described with reference to FIG. 5(a) to FIG. 5(e), wherein reference numerals 1 and 4 denote a pair of electrodes, reference numeral 2 an electron-conducting layer, reference numeral 3 an electron-conducting layer (or a light-emitting layer), reference numeral 5 a hole-conducting layer, reference numeral 6 a hole-conducting layer (or a light-emitting layer), reference numeral 7 a light-emitting layer, and reference numeral 8 a charge-generating layer.

Figure 5:
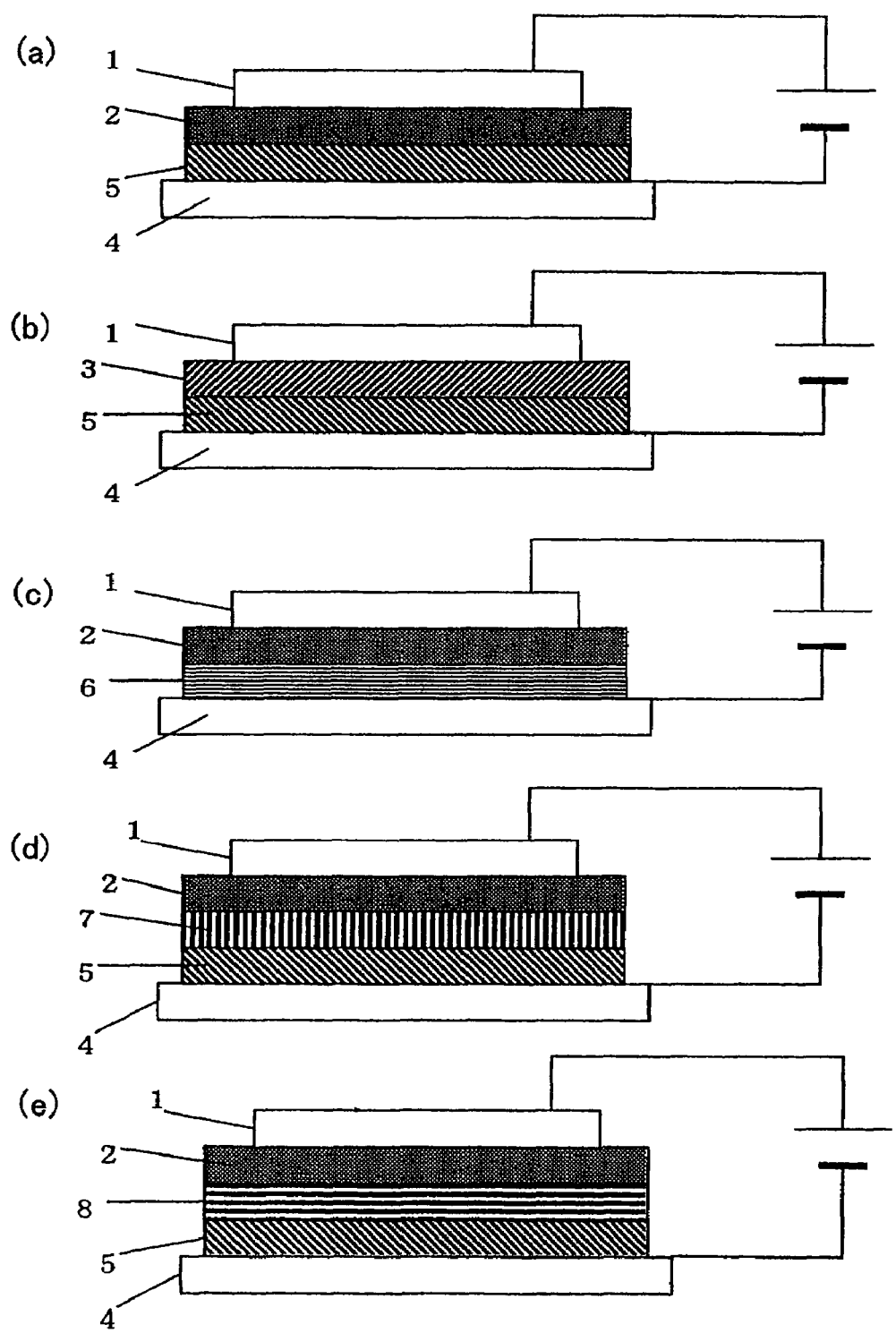
FIG. 5(a) to FIG. 5(e) are schematic cross-sectional views each illustrating an example of a functional device according to an embodiment of the present invention.

With Structure 1 illustrated in FIG. 5(a), Structure 2 illustrated in FIG. 5(b) and Structure 3 illustrated in FIG. 5(c), it is possible to improve the recombination efficiency of positive/ negative carriers injected from the pair of electrodes 1 and 4. In Structure 4 illustrated in FIG. 5(d), it is possible to make more reliable the connection of the electrodes 1 and 4 with the light-emitting layer 7 and the carrier-conducting layers (the electron-conducting layer 2 and the hole-conducting layer 5), and to increase the efficiency of carrier injection from the electrodes 1 and 4. Moreover, as described above in the section for photoelectric conversion device, a group involved in the emission of light or a dye group may be introduced into the hyperbranched macromolecule, or a group involved in the emission of light may be introduced into the core structure. Moreover, hyperbranched macromolecules having different functions may be mixed together to form a self-assembled structure of the hyperbranched macromolecules, so as to structurally integrate the carrier-conducting function and the light-emitting function with each other.

Thus, with a functional device of the present invention, it is possible to incorporate a combination of different functions in a hyperbranched macromolecule, and to incorporate a combination of different functions in a self-assembled structure formed by a non-covalent interaction between molecules. Moreover, a self-assembled structure can be formed by a non-covalent interaction by recoating in a known application method such as a dipping method, an inkjet method or a spin coating method, or when hyperbranched macromolecules are mixed with an ink used in an inkjet method or a solution used in a dipping method or a spin coating method, a self-assembled structure can be formed by a non-covalent interaction in the solution or during the deposition process performed while removing the solvent. Note that a macromolecular structure may be formed directly on the substrate of a functional device, or a macromolecular structure that is prepared separately as described above may be transferred onto the substrate of a functional device.

The self-assembled structure formed by a non-covalent interaction is controlled on a nanostructure molecular level. The thickness of a layered structure, in which each layer has a thickness on the order of 1 nm to 10 nm, can easily be controlled, and even the molecular orientation can easily be controlled. Therefore, the electric field localization effect provides effects such as an increase in the interlayer carrier injection efficiency, whereby the performance can be improved significantly.

An organic transistor device can be obtained by using a macromolecular structure in which one of the hole-conducting layer and the electron-conducting layer is a conductive layer while the other is a semiconductor layer, with an insulating layer being provided between the conductive layer and the semiconductor layer, and by forming a gate electrode, a source electrode and a drain electrode in the macromolecular structure.

A condenser (capacitor) can also be formed by using a macromolecular structure in which one of the hole-conducting layer and the electron-conducting layer is a conductive layer while the other is a semiconductor layer, with an insulating layer being provided between the conductive layer and the semiconductor layer. Furthermore, the hole-conducting layer and the electron-conducting layer may be conductive layers, while an ion-conducting layer is inserted between the conductive layers, or the hole-conducting layer may be a p-type semiconductor layer while the electron-conducting layer may be an n-type semiconductor layer, and these layers may be formed as a continuous layer.

An electrochromic device may be formed from a macromolecular structure in which the hole-conducting layer is a macromolecular layer that can be doped with a p-type dopant, which layer is discolored by an oxidation-reduction reaction, while the electron-conducting layer is a macromolecular layer that can be doped with an n-type dopant, which layer is discolored by an oxidation-reduction reaction, with a layer containing a supporting electrolyte salt being provided between the hole-conducting layer and the electron-conducting layer. Moreover, this device structure can be used also as a polymer secondary cell, in which case it is possible to provide a secondary cell having a large capacity and a low internal resistance.

As described above, the functional device of the present invention includes hyperbranched macromolecules having isotropic characteristics, and includes a macromolecular structure having a self-assembled structure formed by a non-covalent interaction between the hyperbranched macromolecules, whereby it is possible to provide a functional device that has an isotropic and very high carrier conductivity, and also has a high reliability and a high durability with layers thereof being reliably in contact with one another. Moreover, a functional device of the present invention is formed simply by applying a macromolecule solution (or macromolecules), and it is possible to control the thickness and even the molecular orientation on a nanoscale molecular level.

Furthermore, it is possible to incorporate a combination of different functions in a hyperbranched macromolecule by introducing various functional groups into the hyperbranched macromolecule, and to incorporate a combination of different functions in a self-assembled structure formed by a non-covalent interaction. Moreover, it is possible to provide a novel functional device and a novel device structure exhibiting a novel function. Such a structure cannot be formed by using a conventional polymer material or a conventional polymer alloy-based material.

Examples of synthesized hyperbranched macromolecules will now be described.

A polypropyleneimine-based hyperbranched macromolecule can be obtained as follows. First, a primary amine compound of Chemical Formula 1 is cyanoethylated with acrylonitrile by using an acetic acid catalyst in water-toluene to produce a compound of Chemical Formula 2.

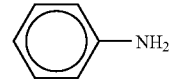

[Chemical Formula 1]

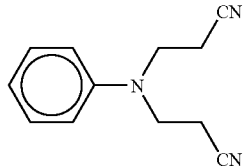

[Chemical Formula 2]

Then, the compound of Chemical Formula 2 is hydrogenated by using a cobalt catalyst (Raney catalyst) to produce a compound of Chemical Formula 3.

[Chemical Formula 3]
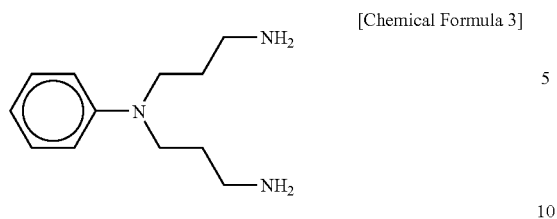
Thus, branched two amino groups (Chemical Formula 2) can be obtained from one amino group (Chemical Formula 1), and compounds of Chemical Formula 4, Chemical Formula 5 and Chemical Formula 6 can easily be obtained by repeating this reaction.
[Chemical Formula 4]
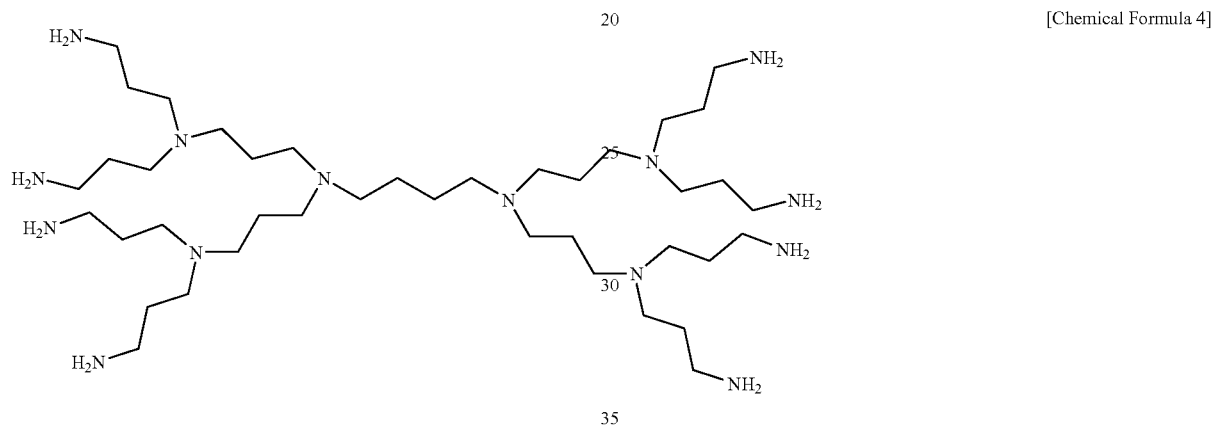
[Chemical Formula 5]
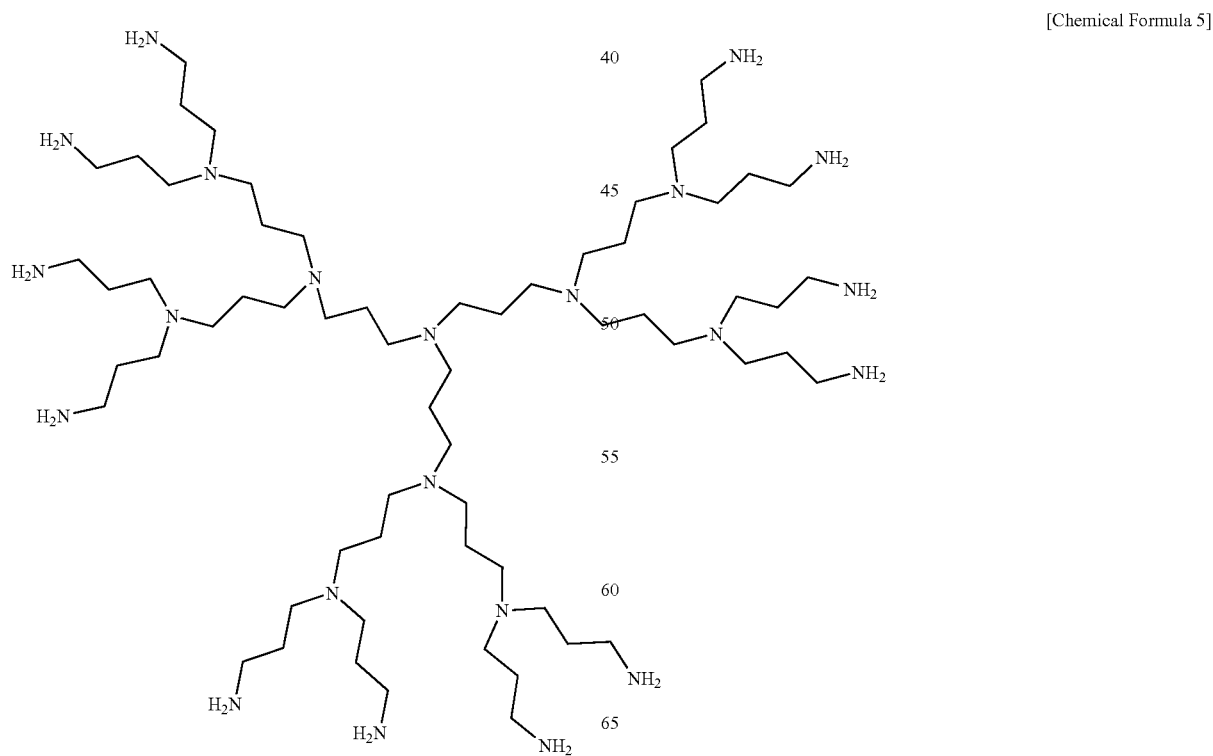

-continued
[Chemical Formula 6]
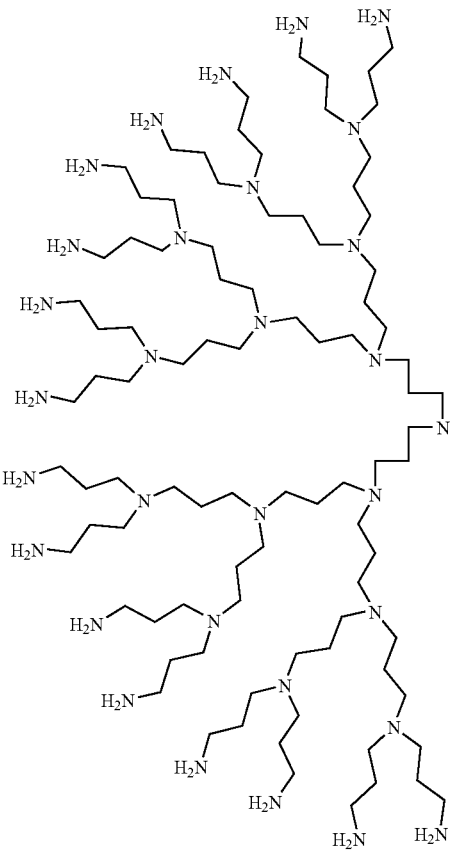
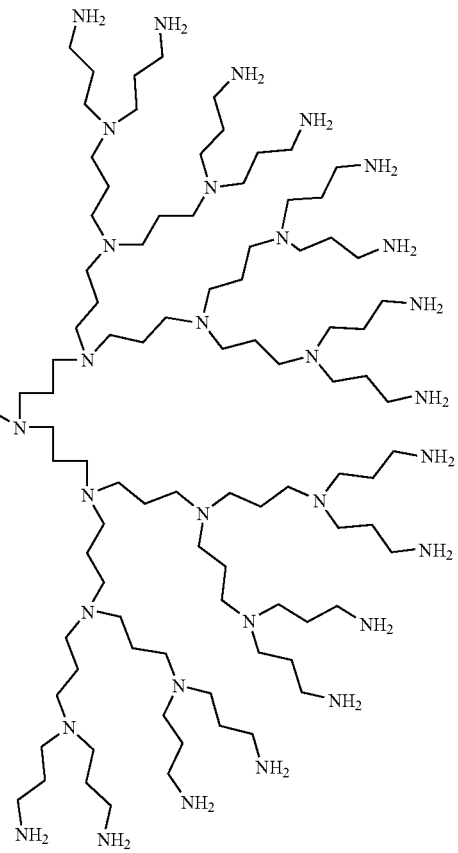
Moreover, a dendrimer such as that of Chemical Formula 7, etc., can be synthesized by a divergent method, in which a hyperbranched macromolecule is synthesized from the core to the periphery or a convergent method in which a hyperbranched macromolecule is synthesized from the periphery to the core.

[Chemical Formula 7]

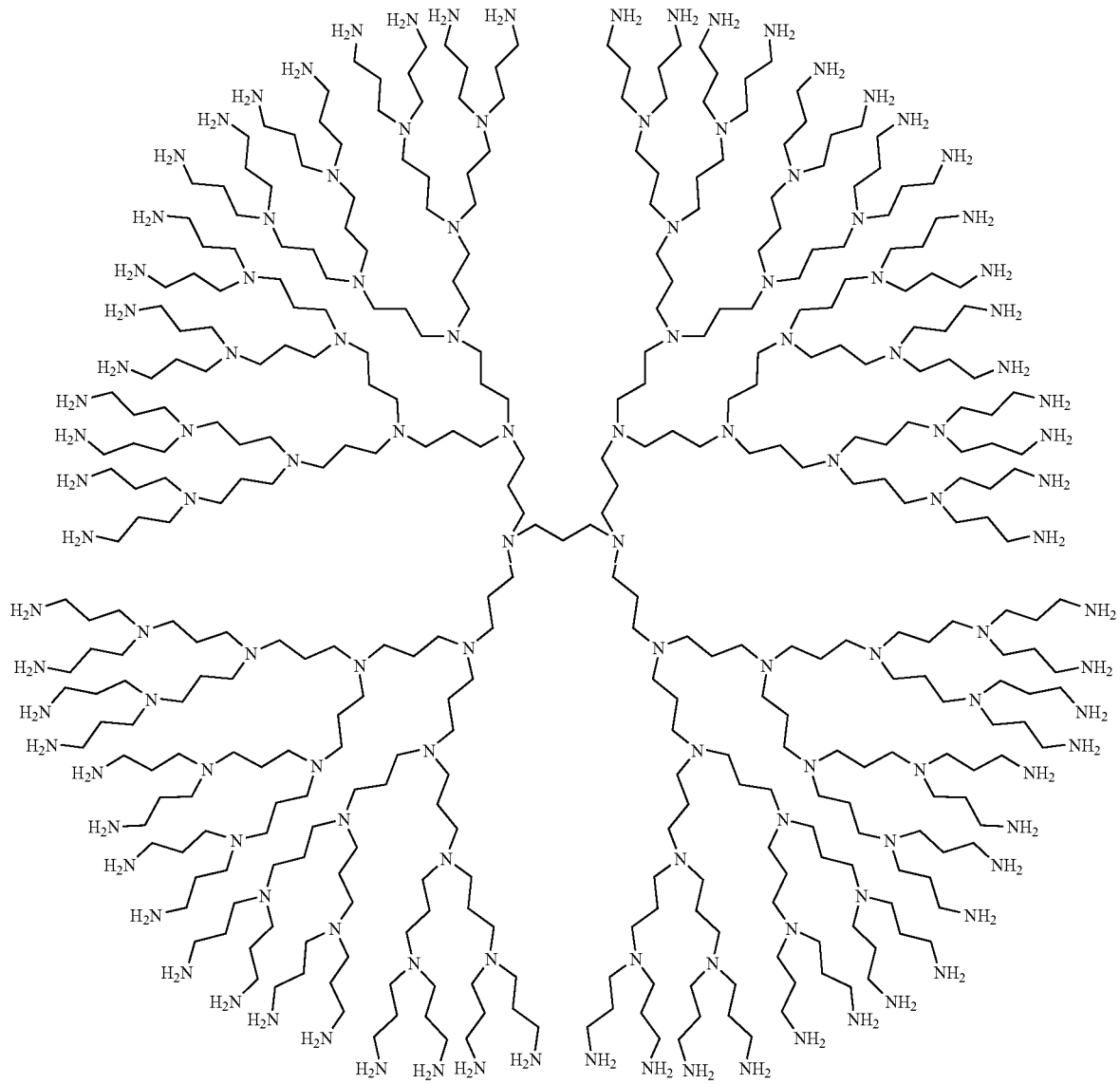

Alternatively, commercially-available polypropyleneimine dendrimers (DAB-Am-4, 8, 16, 32, 64 from a catalog of Aldrich) may be used. Then, 4-(N,N-diethylamino)ethyl benzoate, 4-(1,8-naphthaldiimidyl benzoate)methyl, or the like, is dissolved in N,N-dimethyl formaldehyde, and concentrated by heating with stirring under a reduced pressure at 60° C. while distilling away the ethanol being produced, after which the concentrate is purified by silica gel chromatography, to obtain a substance in which the amino group at a branch terminal of the dendrimer or hyperbranched polymer is converted into an amide of 4-diethylamino benzoate, an amide of 4-(1,8-naphthalimidyl)benzoate, or the like.

A polybenzylether-based hyperbranched macromolecule can be obtained as follows. That is, 4-bromomethylene benzoate methyl (Chemical Formula 8), or the like, and 1,3,5-trihydroxybenzene (Chemical Formula 9) are subjected to an etherification reaction using anhydrous potassium carbonate and 18-crown-6 ether in a manner similar to that described in Hawker, C. J., et al.; J. Am. Chem. Soc., 112, p. 7638 (1990) to obtain a polybenzylether-based dendrimer or hyperbranched polymer such as a hyperbranched macromolecular compound (Chemical Formula 10). In a case where 4-bromomethylene benzoate methyl is used, a methylester group at a terminal can be converted into a carboxyl group, a potassium salt, or the like.

[Chemical Formula 8]

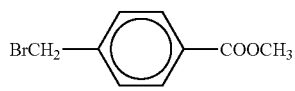

[Chemical Formula 9]

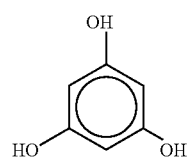

[Chemical Formula 10]
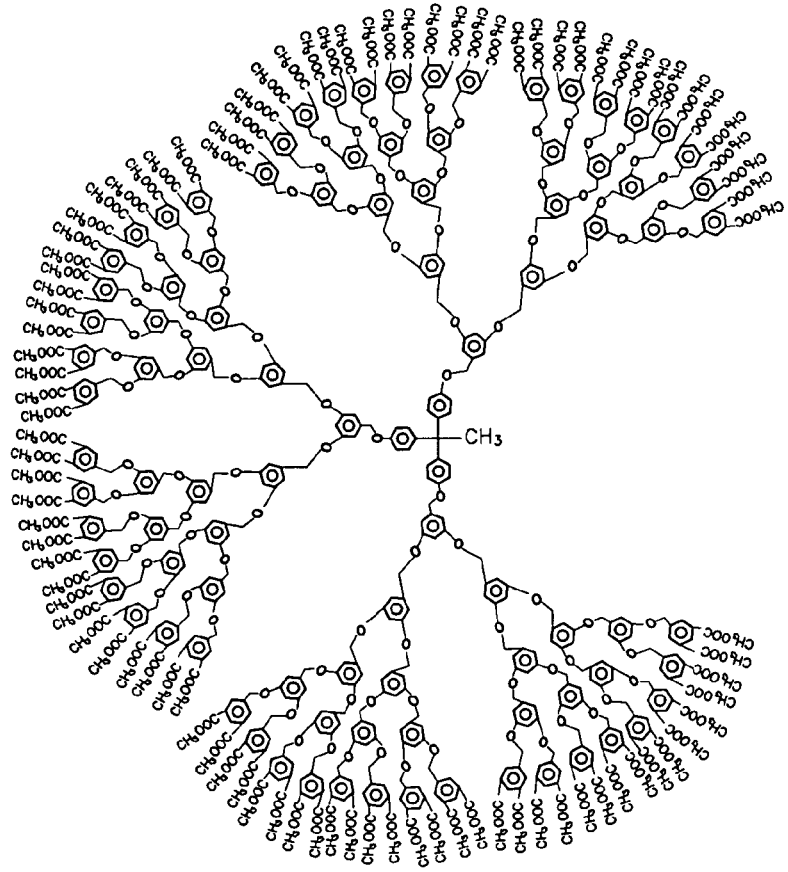

A polyphenylenevinylene-based hyperbranched macromolecule can be obtained as follows. Based on Shirshendu K. Deb, et al.; J. Am. Chem. Soc, 119, p. 9079 (1997), 3,5-di-tert-butylbenzaldehyde (Chemical Formula 11), a product (Chemical Formula 12) obtained through an Arbuzov reaction from 5-bromo-m-xylene, and sodium hydride are reacted together in N-methyl-2-pyrrolidone (NMP) to obtain a product (Chemical Formula 13). Furthermore, two bromine atoms in 1,3,5-tribromobenzene are converted into vinyl groups through a still coupling reaction to obtain a product (Chemical Formula 14). By repeating these steps, a polyphenylenevinylene-based dendron such as a product (Chemical Formula 15) can be obtained. The obtained product can be reacted with another substance that can be a core structure such as benzotriphosphate (Chemical Formula 16) to obtain a polyphenylenevinylene-based dendrimer or hyperbranched polymer such as a hyperbranched macromolecular compound (Chemical Formula 17).

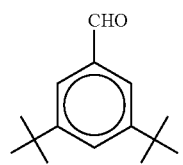

[Chemical Formula 11]

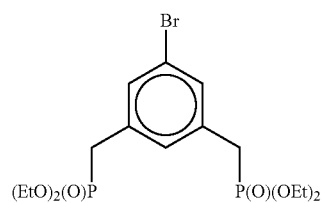

[Chemical Formula 12]

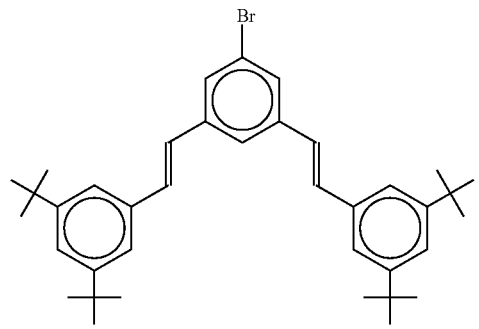

[Chemical Formula 13]

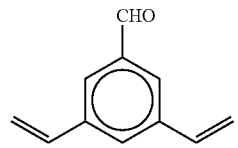

[Chemical Formula 14]

-continued
[Chemical Formula 15]
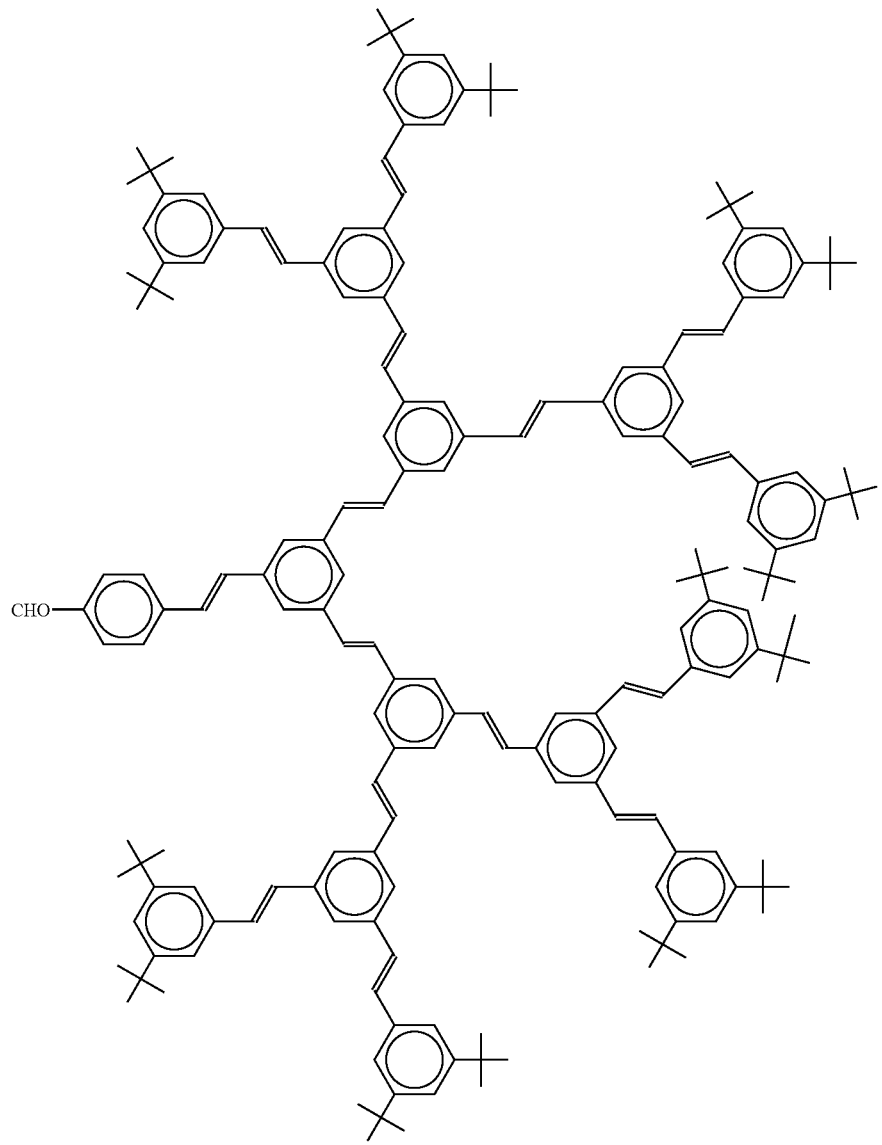
[Chemical Formula 16]
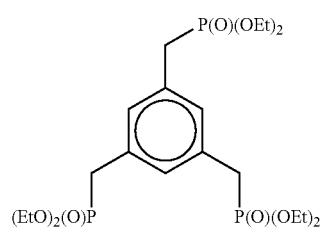

[Chemical Formula 17]

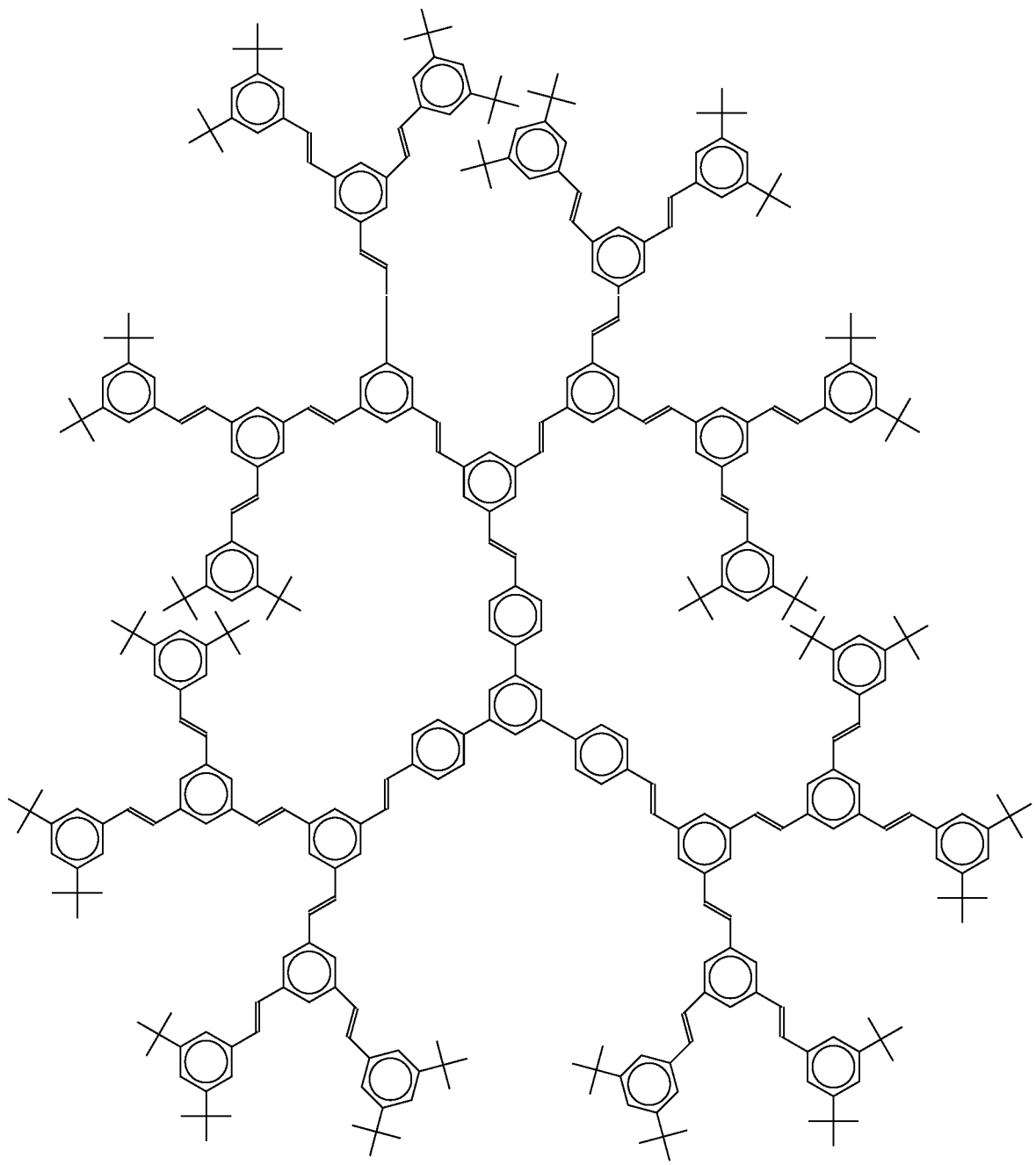

While examples of hyperbranched macromolecules in which the core structure and the hyperbranched structure are bound to each other via a covalent bond have been described above, the hyperbranched macromolecule used in the present invention is not limited to this. Alternatively, the core structure and the hyperbranched structure may be bound to each other via a non-covalent bond.

For example, with Molecule A shown in (Chemical Formula 18) below, six molecules are bound together by hydrogen bonds to form a dendrimer as shown in (Chemical Formula 19).

[Chemical Formula 18]
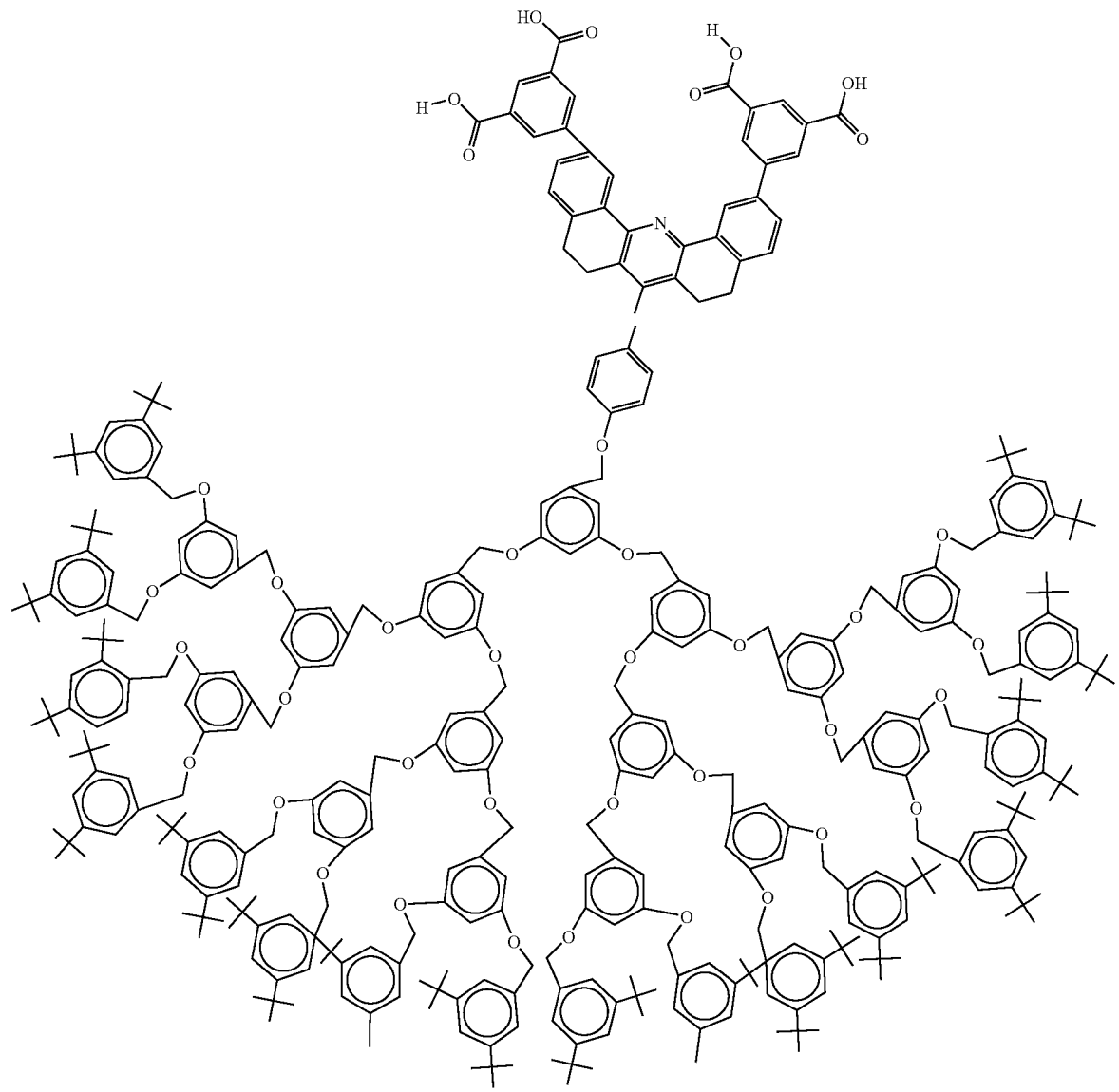

[Chemical Formula 19]
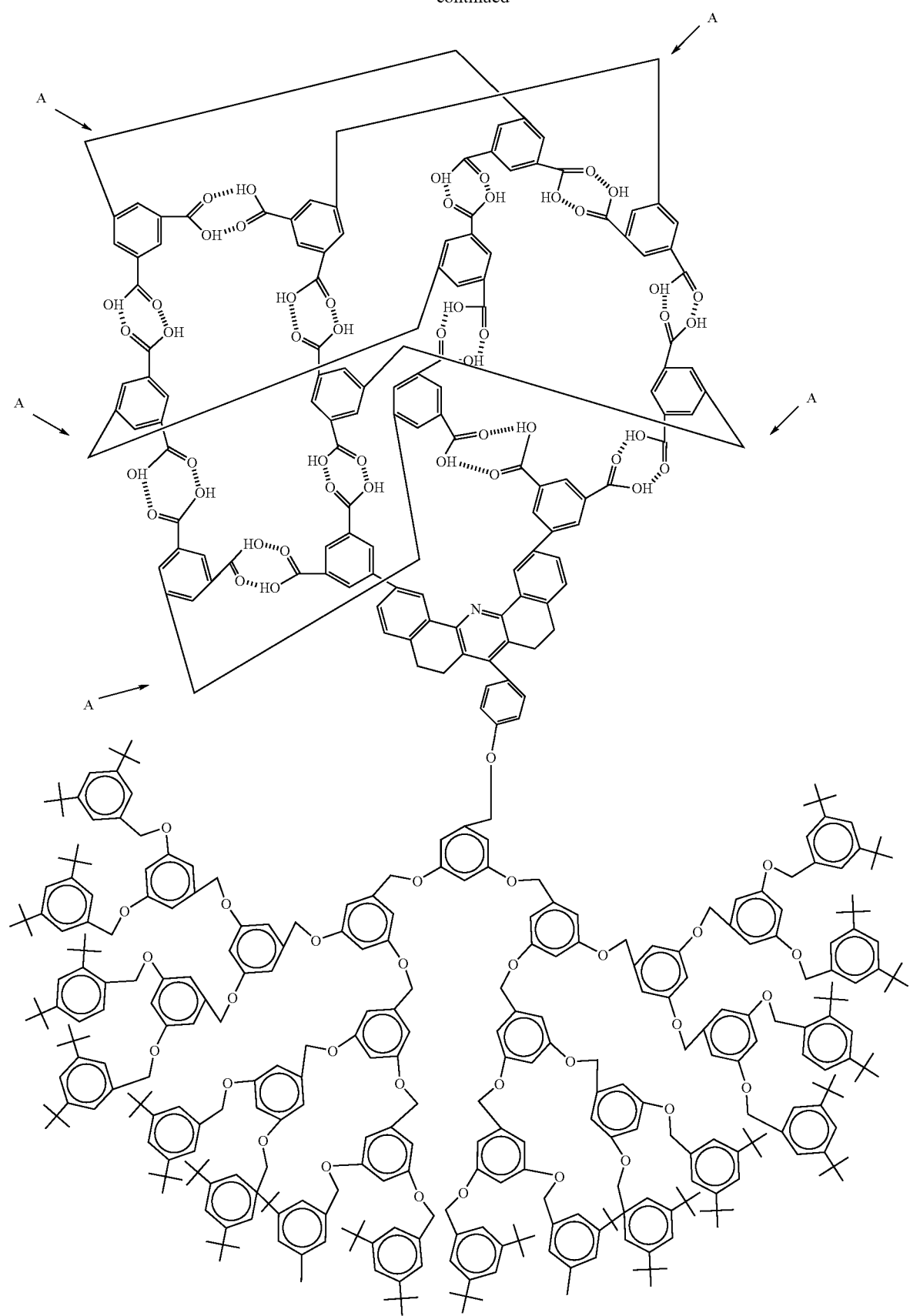

As described above in detail, the present invention makes it possible to improve the performance of a functional device with a novel device structure using hyperbranched macromolecules, and to easily produce such a functional device. Therefore, the present invention has a very high industrial value.

Now, examples of functional devices according to an embodiment of the present invention will be described together with comparative examples. Note however that the present invention is not limited to these examples.

EXAMPLE 1

Organic Light-Emitting Device

ITO was formed as an anode on a glass substrate, and a tetrahydrofuran solution of Hyperbranched Macromolecular Compound 1 (Chemical Formula 20) partially randomly ionized was subjected to a spin coating process at room temperature to deposit Hyperbranched Macromolecular Compound 1 as the hole-conducting layer. The thickness was 100 nm. Furthermore, a tetrahydrofuran solution of Hyperbranched Macromolecular Compound 2 (Chemical Formula 21) that gives both functions as a light-emitting layer and an electron-conducting layer was subjected to a spin coating process at room temperature to deposit Hyperbranched Macromolecular Compound 2, thereby obtaining a macromolecular structure in which a self-assembled structure was formed through an electrostatic interaction between a thin film of Hyperbranched Macromolecular Compound 1 and a thin film of Hyperbranched Macromolecular Compound 2. The thickness of Hyperbranched Macromolecular Compound 2 was 50 nm. Then, an MgAg alloy (weight ratio 10:1) was vapor-deposited to form a cathode, thereby producing a light-emitting device having a structure as illustrated in FIG. 5(a).

[Chemical Formula 20]

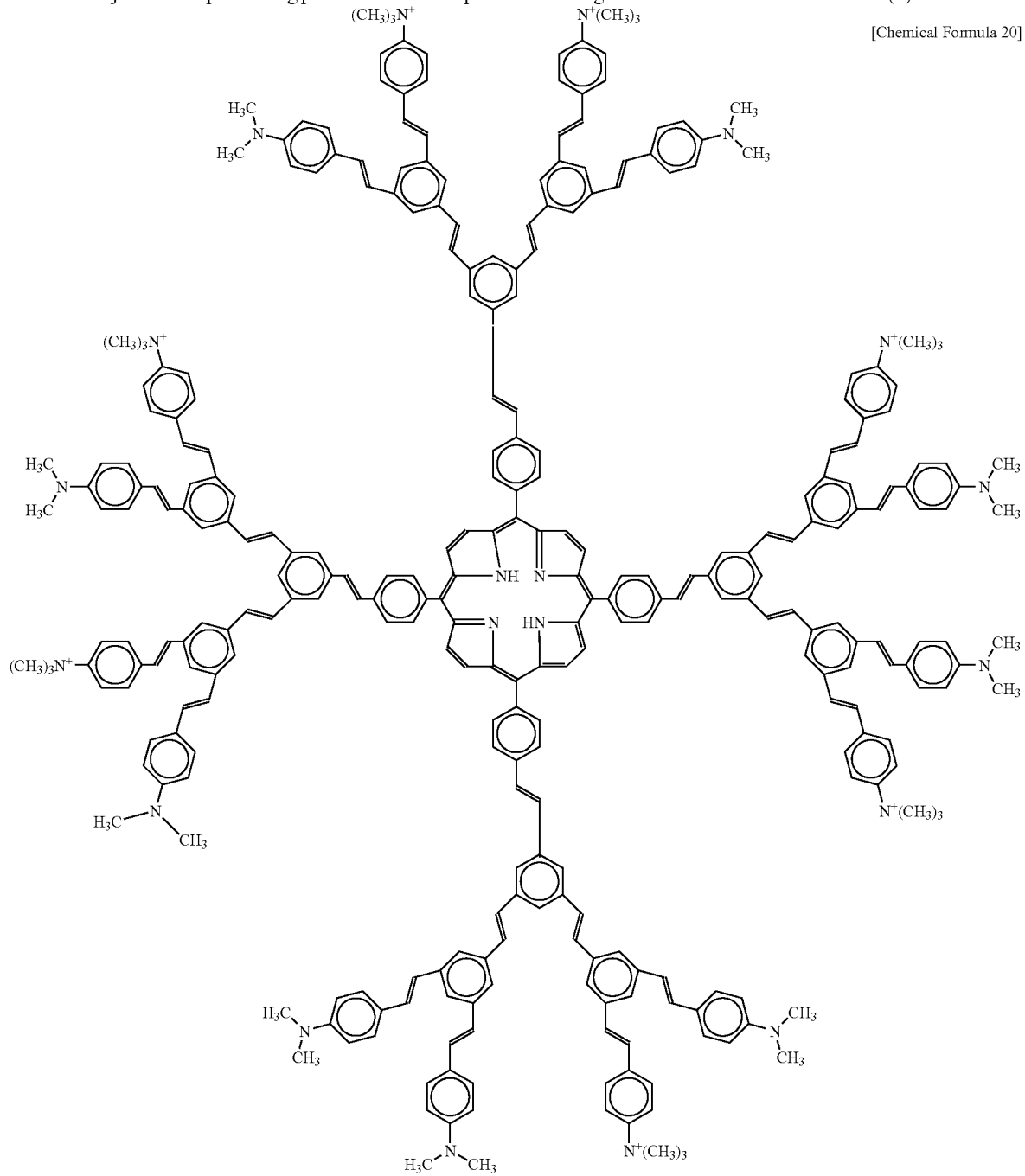

[Chemical Formula 21]
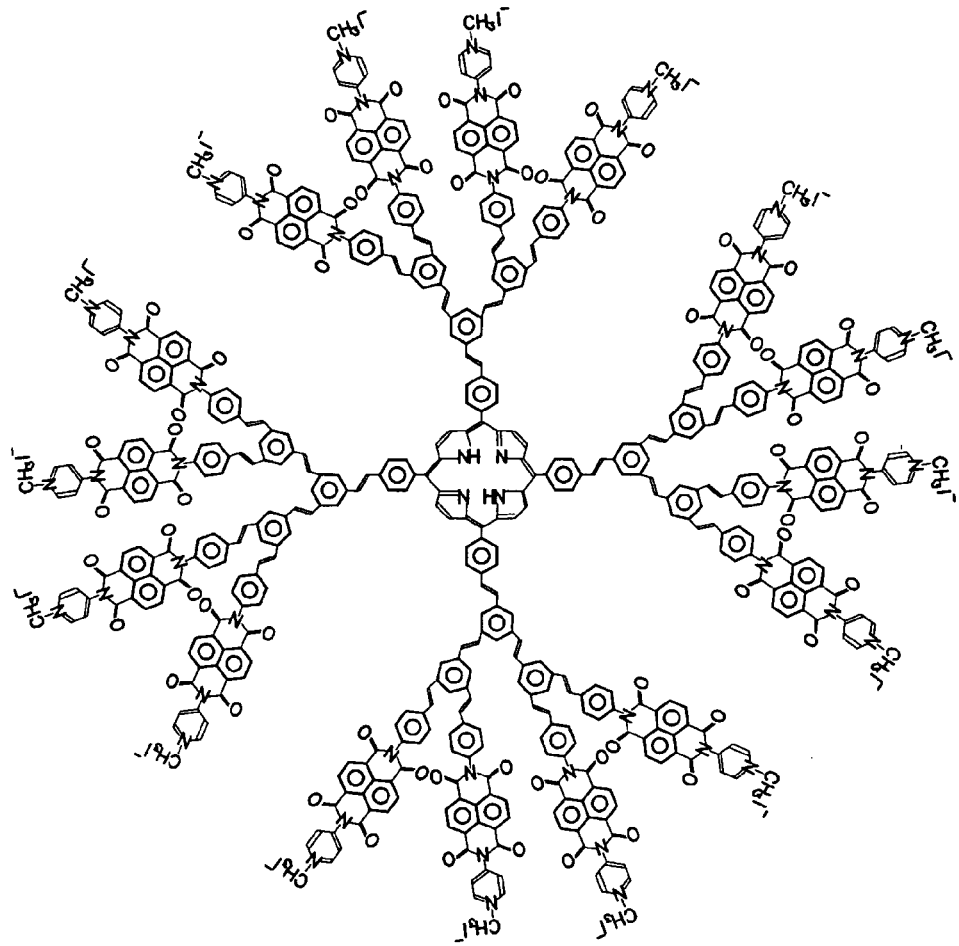

A predetermined voltage was applied to the light-emitting device to drive the device to emit light, and the initial luminance was measured. The device exhibited a luminance of 1500 cd/m$^2$. Furthermore, it took 3000 hours or more for the luminance to decrease to half of the initial luminance.

COMPARATIVE EXAMPLE 1

A light-emitting device similar in structure to that of Example 1 was produced, except that a mixture of polyethylenedioxythiophene and sodium polystyrene sulfonate was used for the hole-conducting layer.

A predetermined voltage was applied to the light-emitting device to drive the device to emit light, and the initial luminance was measured. The device exhibited a luminance of 800 cd/m$^2$. Furthermore, it took 800 hours for the luminance to decrease to half of the initial luminance.

EXAMPLE 2

Organic Light-Emitting Device

ITO was formed as an anode on a glass substrate, and a tetrahydrofuran solution of Hyperbranched Macromolecular Compound 3 (Chemical Formula 22) was subjected to a spin coating process at room temperature to deposit Hyperbranched Macromolecular Compound 3 as the hole-conducting layer. The thickness was 50 nm. Moreover, a tetrahydrofuran solution of Hyperbranched Macromolecular Compound 4 (Chemical Formula 23) was subjected to a spin coating process at room temperature to deposit Hyperbranched Macromolecular Compound 4 as the light-emitting layer. The thickness was 30 nm. Furthermore, a tetrahydrofuran solution of Hyperbranched Macromolecular Compound 5 (Chemical Formula 24) was subjected to a spin coating process at room temperature to deposit Hyperbranched Macromolecular Compound 5 as the electron-conducting layer, thereby obtaining a macromolecular structure in which a self-assembled structure was formed through an electrostatic interaction between a thin film of Hyperbranched Macromolecular Compound 4 and a thin film of Hyperbranched Macromolecular Compound 5. The thickness of Hyperbranched Macromolecular Compound 5 was 50 nm. Then, an MgAg alloy (weight ratio 10:1) was vapor-deposited to form a cathode, thereby producing a light-emitting device having a structure as illustrated in FIG. 5(d).

A predetermined voltage was applied to the light-emitting device to drive the device to emit light, and the initial luminance was measured. The device exhibited a luminance of 1500 cd/m$^2$. Furthermore, it took 3000 hours or more for the luminance to decrease to half of the initial luminance.

[Chemical Formula 22]
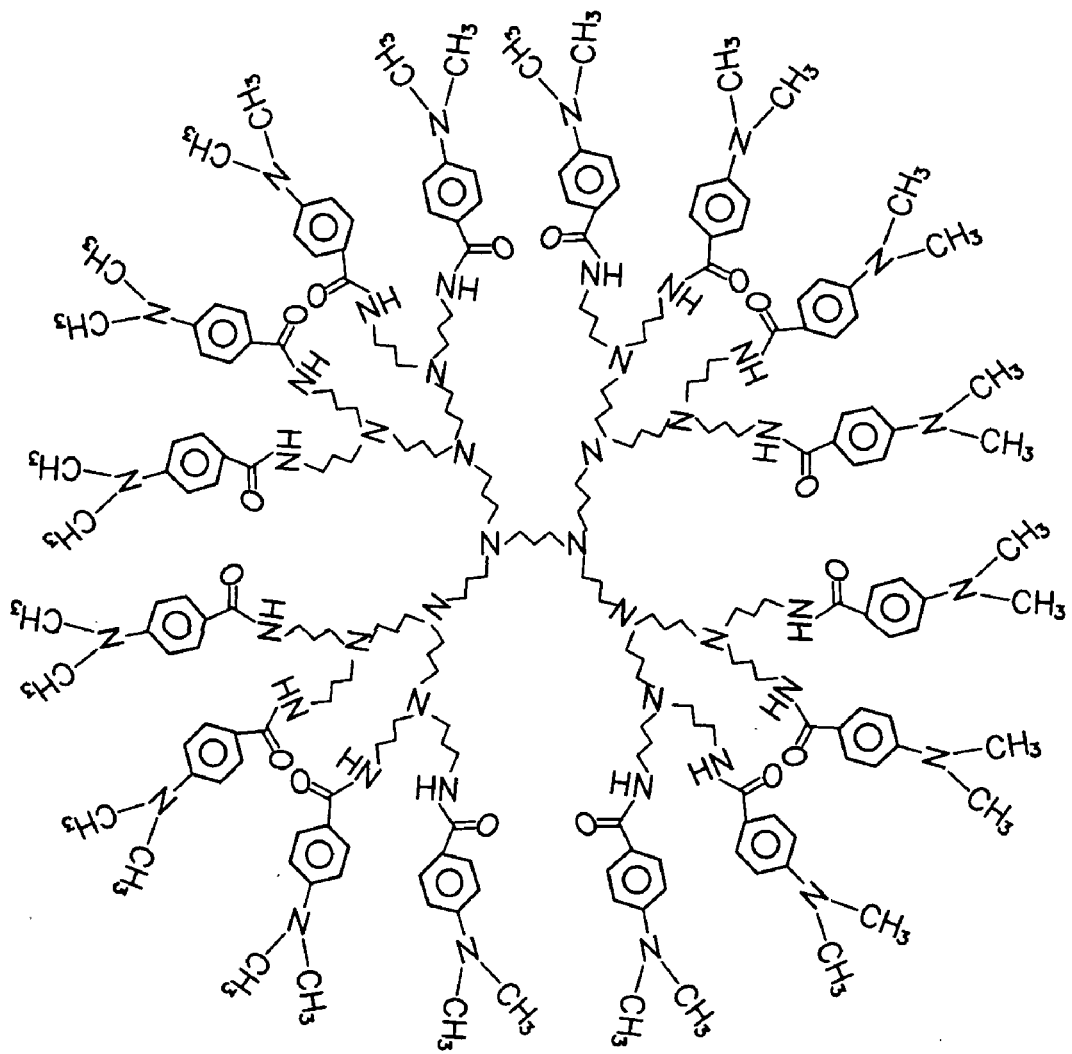

[Chemical Formula 23]
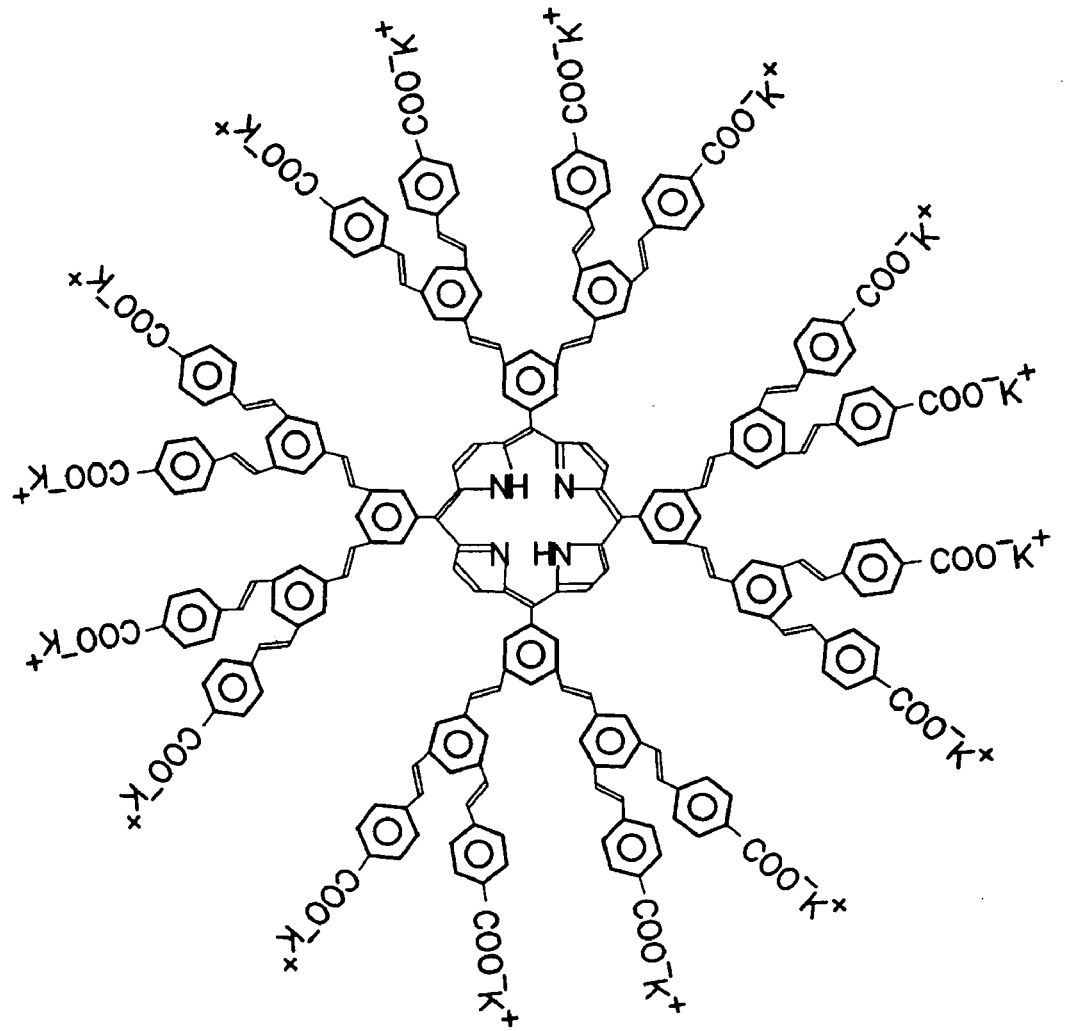

[Chemical Formula 24]
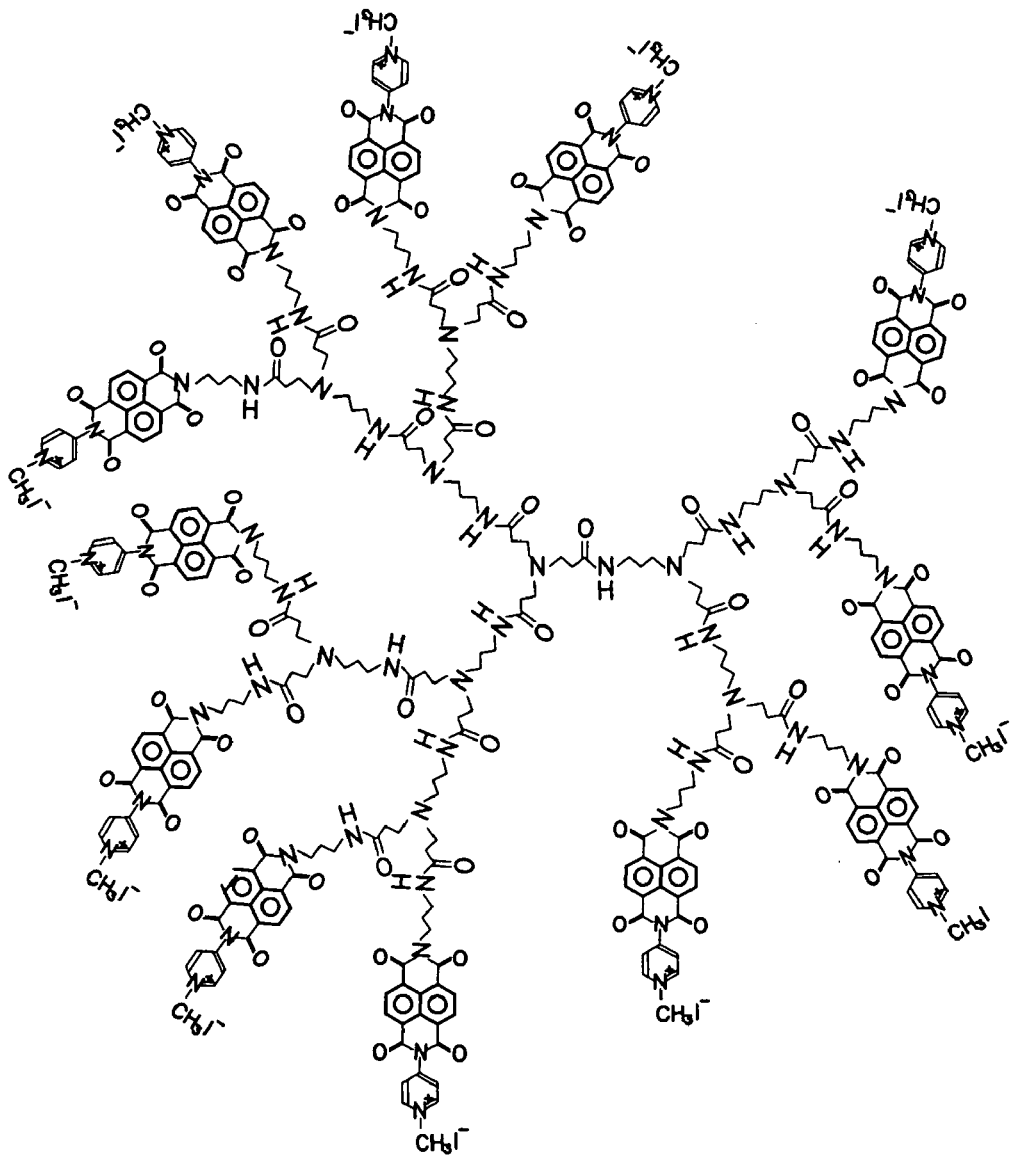

COMPARATIVE EXAMPLE 2

A light-emitting device similar in structure to that of Example 2 was produced, except that a mixture of polyethylenedioxythiophene and sodium polystyrene sulfonate was used for the hole-conducting layer while using polyhexylthiophene for the light-emitting layer. A predetermined voltage was applied to the light-emitting device to drive the device to emit light, and the initial luminance was measured. The device exhibited a luminance of 800 cd/m$^2$. Furthermore, it took 800 hours for the luminance to decrease to half of the initial luminance.

EXAMPLE 3

Organic Rectification Device

An MgAg alloy (weight ratio 10:1) electrode was formed by vapor deposition on a glass substrate, and a tetrahydrofuran solution of Hyperbranched Macromolecular Compound 1 (Chemical Formula 20) was subjected to a spin coating process at room temperature to deposit Hyperbranched Macromolecular Compound 1 as the hole-conducting layer. The thickness was 50 nm. Furthermore, a tetrahydrofuran solution of Hyperbranched Macromolecular Compound 5 (Chemical Formula 24) was subjected to a spin coating process at room temperature to deposit Hyperbranched Macromolecular Compound 5 as the electron-conducting layer, thereby obtaining a macromolecular structure in which a self-assembled structure was formed through an electrostatic interaction between a thin film of Hyperbranched Macromolecular Compound 1 and a thin film of Hyperbranched Macromolecular Compound 5. The thickness of Hyperbranched Macromolecular Compound 5 was 50 nm. Then, an MgAg alloy (weight ratio 10:1) was vapor-deposited to form an upper electrode, thereby producing an organic rectification device.

The rectification device was blocked from light, and the current-voltage characteristics thereof were measured. It exhibited a rectifying characteristic such that a current flows only when the upper electrode is set to the negative side. A similar measurement, conducted after leaving the rectification device at room temperature for three months, indicated that there was no characteristics degradation and no peeling at the film interface.

COMPARATIVE EXAMPLE 3

An organic rectification device similar in structure to that of Example 3 was produced, except that a mixture of polyethylenedioxythiophene and sodium polystyrene sulfonate was used for the hole-conducting layer.

The rectification device was blocked from light, and the current-voltage characteristics thereof were measured. It exhibited a rectifying characteristic such that a current flows when the upper electrode is set to the negative side. However, a similar measurement, conducted after leaving the rectification device at room temperature for three months, indicated there was characteristics degradation and peeling at the film interface.

EXAMPLE 4

Organic Solar Cell Device

ITO was formed as an electrode on a glass substrate, and a tetrahydrofuran solution of Hyperbranched Macromolecular Compound 3 (Chemical Formula 22) was subjected to a spin coating process at room temperature to deposit Hyperbranched Macromolecular Compound 5 as the hole-conducting layer. The thickness was 50 nm. Moreover, a tetrahydrofuran solution of Hyperbranched Macromolecular Compound 6 (Chemical Formula 25) was subjected to a spin coating process at room temperature to deposit Hyperbranched Macromolecular Compound 6 as the charge-generating layer. The thickness was 30 nm. Furthermore, a tetrahydrofuran solution of Hyperbranched Macromolecular Compound 5 (Chemical Formula 24) was subjected to a spin coating process at room temperature to deposit Hyperbranched Macromolecular Compound 5 as the electron-conducting layer, thereby obtaining a macromolecular structure in which a self-assembled structure was formed through an electrostatic interaction between a thin film of Hyperbranched Macromolecular Compound 6 and a thin film of Hyperbranched Macromolecular Compound 5. The thickness of Hyperbranched Macromolecular Compound 5 was 50 nm. Then, an MgAg alloy (weight ratio 10:1) was vapor-deposited to form an electrode, thereby producing an organic solar cell device.

[Chemical Formula 25]
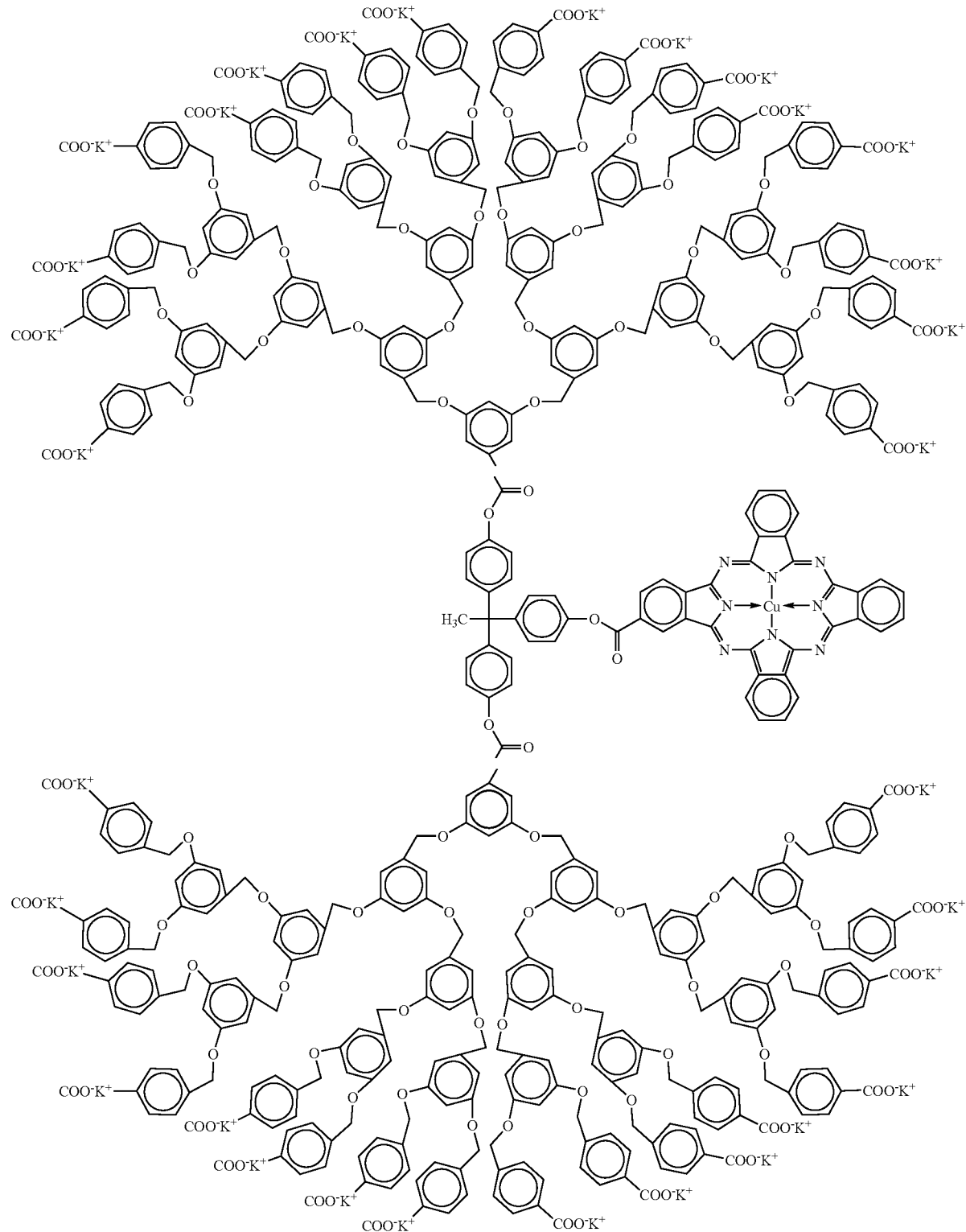

The initial energy conversion efficiency of the solar cell device was measured while the solar cell device was irradiated with light from a tungsten lamp, in which wavelengths of 400 nm or less were cut off, and the measurement indicated desirable values of 1.8 to 2.2%.

COMPARATIVE EXAMPLE 4

A light-emitting device similar in structure to that of Example 2 was produced, except that a mixture of polyethylenedioxythiophene and sodium polystyrene sulfonate was used for the hole-conducting layer while using copper phthalocyanine for the charge-generating layer.

The initial energy conversion efficiency of the solar cell device was measured while the solar cell device was irradiated with light from a tungsten lamp, in which wavelengths of 400 nm or less were cut off, and the measurement indicated values of 1.0 to 1.2%.

These results indicated that in the functional devices of Examples 1 to 4, the functional layer including two or more layers of hyperbranched macromolecules formed a self-assembled structure by a non-covalent interaction, thereby stabilizing the device structure (particularly the interface structure), thus considerably improving the characteristics.

Now, the structure of a transistor including a semiconductor layer having a self-assembled structure of hyperbranched macromolecules will be described. A field effect transistor (hereinafter referred to as an "FET") suitable for use as an active device of an active driving-type display apparatus will be described below. However, the present invention is not limited to an FET, and may also be applicable to other transistors.

Figure 6:
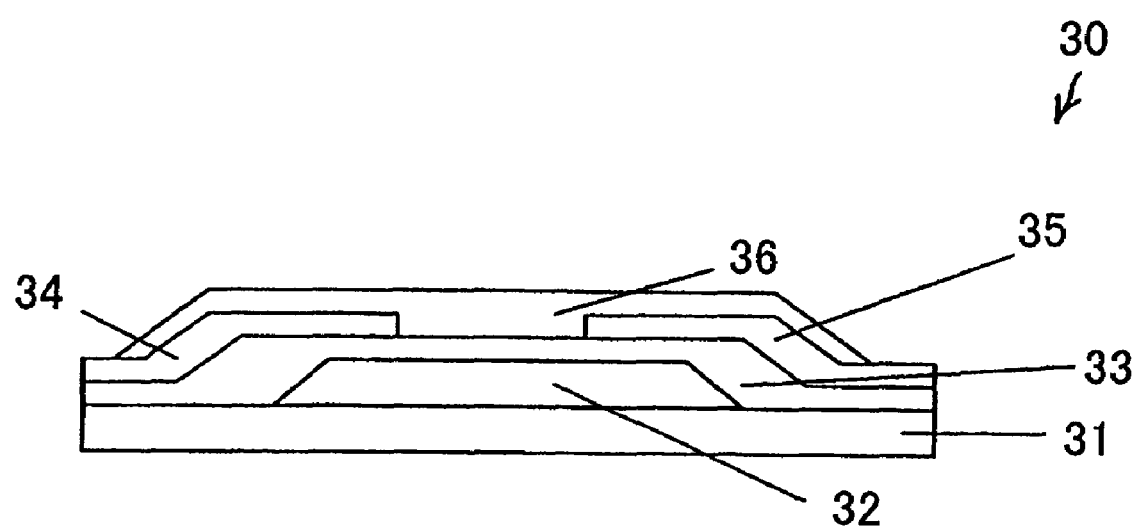
FIG. 6 is a schematic cross-sectional view illustrating a field effect transistor 30 according to an embodiment of the present invention.

FIG. 6 is a schematic cross-sectional view illustrating an FET 30 of the present invention. The FET 30 is a transistor of a bottom-gate type, and includes a gate electrode 32 formed on an insulative substrate 31, a gate insulating layer 33 formed so as to cover the gate electrode 32, a source electrode 34 and a drain electrode 35 formed on the gate insulating layer 33, and a semiconductor layer 36 formed between the source electrode 34 and the drain electrode 35. Moreover, the semiconductor layer 36 is formed so as to partially cover the source electrode 34 and the drain electrode 35.

For example, the transistor 30 can be produced as follows.

First, the gate electrode 32 is formed on the insulative substrate 31. The material of the gate electrode 32 may be an inorganic material such as Cr, Al, Ta, Mo, Nb, Cu, Ag, Au, Pt, Pd, In, Ni, Nd, an alloy thereof, polysilicon, amorphous silicon, tin oxide, indium oxide or indium tin oxide (ITO), or an organic material such as a doped conductive macromolecule (e.g., a mixture of polyethylenedioxythiophene (PEDOT) and sodium polystyrene sulfonate). Moreover, two or more layers may be layered on each other. A conductive film is deposited by using a known deposition method suitable for the material, such as a vapor deposition method, a sputtering method, an application method or a printing method, after which the conductive film is made into a predetermined shape of the gate electrode 32 by a photolithography step and an etching step.

Then, the gate insulating layer 33 is formed so as to cover the gate electrode 32. The material of the gate insulating layer 333 may be an inorganic material such as $SiO_2$, SiN or $Al_2O_3$, or a macromolecular material such as polychloropylene polyethylene terephthalate, polyoxymethylene, polyvinylchloride, polyvinylidene fluoride, polymethyl methacrylate, polycarbonate, polyimide, polysulfone or polyorganosiloxane. Moreover, two or more layers may be layered on each other.

The gate insulating layer 33 is also deposited by a known deposition method, and is patterned as necessary.

The source electrode 34 and the drain electrode 35 are formed on the gate insulating layer 33. The source electrode 34 and the drain electrode 35 are formed by a method similar to that for the gate electrode 32 using a material similar to that for the gate electrode 32. Of course, the material of the gate electrode 32 may be the same as, or different from, that for the source electrode 34 and the drain electrode 35. Two or more layers may be layered on each other.

Then, an organic semiconductor layer including hyperbranched macromolecules is formed. For example, a semiconductor layer made of hyperbranched macromolecules can be formed by preparing a solution of hyperbranched macromolecules and applying the solution by various application methods and printing methods, as described above. By performing a heat treatment as necessary after drying, a film of hyperbranched macromolecules can be formed.

Through these steps, the FET 30 of the present invention can be produced. The structure of the FET of the present invention is not limited to the example above, but may alternatively be of a top-gate type. Moreover, it may be of a non-stacked-type structure where the drain electrode, the gate electrode and the source electrode are arranged next to one another in the same layer.

The semiconductor layer of an organic FET of the present invention includes a hyperbranched macromolecule, and has a self-assembled structure formed by a non-covalent interaction via the hyperbranched macromolecule, whereby it has a high carrier mobility. Furthermore, it is unlikely to be influenced by oxygen or water in the air, thereby providing a high stability, a high reliability and a high durability. Moreover, if a hyperbranched macromolecule whose stereostructure is disc-shaped or spherical (including ellipsoidal) is used, it is possible to obtain a semiconductor layer having an isotropic conductivity and a high conductivity.

Moreover, the semiconductor layer can be formed simply by applying or printing a solution containing hyperbranched macromolecules, and it is possible to control the thickness and even the molecular orientation on a nanoscale molecular level. Since the formation of the semiconductor film does not require high temperatures, it can easily be formed on a plastic substrate.

Moreover, a film having such a level of conductivity that it can be used as an electrode can be formed by, for example, increasing the impurity dose. Therefore, the gate electrode 32, the source electrode 34 and the drain electrode 35 can all be formed by films including hyperbranched macromolecules. The FET characteristics can be further improved by, for example, selecting the materials so that a self-assembled structure is formed by a non-covalent interaction between the hyperbranched macromolecule of the source electrode 34 and the drain electrode 35 and the hyperbranched macromolecule of the semiconductor layer 36. Also in a case where a conventional conductive macromolecule is used for the source electrode 34 and the drain electrode 35, the FET characteristics can be improved by making a self-assembled structure be formed by a non-covalent interaction between the conductive macromolecule of these electrodes and the hyperbranched macromolecule of the semiconductor layer 36.

Conductive macromolecules that can be used as electrode materials other than hyperbranched macromolecules may include, for example, those described above, i.e., those obtained by introducing a side chain such as a phthalocyanine-based derivative, an azo compound-based derivative, a perylene-based derivative, a quinacridone-based derivative, a polycyclic quinine-based derivative, a cyanin-based derivative, a fullerene derivative, a derivative of a nitrogen-containing cyclic compound such as indole or carbazole, a hydrazone derivative, a triphenylamine derivative or a polycyclic aromatic compound derivative to a main chain such as a polystyrene chain, a polysiloxane chain, a polyether chain, a polyester chain, a polyamide chain or a polyimide chain. Moreover, such macromolecules other than hyperbranched macromolecules may also include: an aromatic conjugated macromolecule such as polyparaphenylene, an aliphatic conjugated macromolecule such as polyacetylene, a heterocyclic conjugated macromolecule such as polypyrrole and polythiophene, a hetero atom-containing conjugated macromolecule such as polyanilines and polyphenylenesulfide, which are conjugated macromolecule chains; a carbon-type conjugated macromolecule, e.g., a combined conjugated macromolecule, in which structural units of the above conjugated macromolecules are alternately connected together, such as poly(phenylenevinylene), poly(arylenevinylene) or poly(thienylenevinylene); polysilanes; disilanylene polymers; and a disilanylene-carbon-based conjugated polymer structure.

Furthermore, it is possible to incorporate a combination of different functions in a hyperbranched macromolecule by introducing various functional groups into the hyperbranched macromolecule, and to incorporate a combination of different functions in a self-assembled structure formed by a non-covalent interaction. Moreover, it is possible to provide a novel organic FET and a novel device structure exhibiting a novel function. Such a structure cannot be formed by using a conventional polymer material or a conventional polymer alloy-based material.

The FET of the present invention can suitably be used in a liquid crystal display apparatus or an organic EL display apparatus. For example, when producing a display apparatus, it is necessary to form a pixel electrode connected to the drain electrode 35 of the FET 30. With a transmission-type liquid crystal display apparatus, a pixel electrode is formed by using a transparent conductive film such as tin oxide, indium oxide or ITO. With a reflection-type liquid crystal display apparatus, it is formed by using a metal film such as Al or Ag. Moreover, when producing an organic EL display apparatus, a metal film such as Mg, Ca, Al or Au is used. If the same material as that of the drain electrode and the source electrode is used for the pixel electrode, the pixel electrode can be formed in the step of forming the drain electrode and the source electrode. When a different material is used, the pixel electrode is formed before or after the formation of the drain electrode and the source electrode.

By using the FET of the present invention, it is possible to produce at a low cost an active driving-type display apparatus such as a liquid crystal display apparatus or an organic EL display apparatus. Of course, the transistor of the present invention can be used in various other electronic devices.

The hyperbranched macromolecules as described above can be appropriately used for the semiconductor layer of the transistor of the present invention.

According to the present invention, it is possible to improve the performance of a transistor by using a novel semiconductor layer having a self-assembled structure formed by hyperbranched macromolecules, and it is possible to easily produce such a transistor and an active driving-type display apparatus using the same. Therefore, the present invention has a very high industrial value.

Now, examples of transistors according to an embodiment of the present invention and display apparatuses using the same will be described together with comparative examples. Note however that the present invention is not limited to these examples.

EXAMPLE 5

In Example 5, the organic thin film transistor 30 having the inverted-staggered structure illustrated in FIG. 6 was produced. The gate electrode 32 was formed by using Ta, and the source electrode 34 and the drain electrode 35 were formed by using aluminum. For the organic semiconductor layer 36, a polypropyleneimine-based spherical dendrimer shown in (Chemical Formula 7) above was used, and a fifth-generation dendrimer was used in this example.

The transistor 30 of Example 5 was produced by the following procedure.

(1) The gate electrode 32 is formed by depositing Ta on the substrate 1 by a vapor deposition method using a mask.

(2) The surface of the gate electrode 32 is oxidized to form the gate insulating layer 33.

(3) The source electrode 34 and the drain electrode 35 are formed by depositing aluminum by a vapor deposition method using a mask. In this process, the interval between the source electrode 34 and the drain electrode 35 was set so that the channel length was 12 μm.

(4) The organic semiconductor layer 36 is formed by applying the dendrimers shown in (Chemical Formula 7) at predetermined positions by an inkjet method.

A measurement by a time-of-flight method showed that the carrier mobility of the obtained organic thin film FET 30 was 0.3 $cm^2V^{-1}s^{-1}$. Moreover, the ON/OFF current ratio obtained by a current-voltage characteristics evaluation was a value of about 7 orders of magnitude. These mobility and ON/OFF current ratio results are comparable to the performance of a current a-Si device.

EXAMPLE 6

The FET 30 of Example 6 similar to that of Example 5 was produced, except that the organic semiconductor layer 36 was formed by using a polybenzylether-based dendrimer (Chemical Formula 10), which is a dendrimer having a spherical stereostructure.

The carrier mobility of the obtained FET 30 was 0.8 $cm^2V^{-1}s^{-1}$, and the ON/OFF current ratio thereof was a value of about 7 orders of magnitude.

Thus, the mobility was further improved by using a spherical dendrimer, resulting in a mobility that is as high as, or greater than, that of an a-Si device.

EXAMPLE 7

The FET 30 of Example 7 similar to that of Example 5 was produced, except that the organic semiconductor layer 36 was formed by using a polyphenylenevinylene-based disc-shaped dendrimer (Chemical Formula 17), which forms a self-assembled structure by a π-conjugate interaction. Polyphenylenevinylene, which is the dendron of this dendrimer, forms a stable self-assembled structure by a π-conjugate interaction between the dendrimers.

The carrier mobility of the obtained FET 30 was 25 $cm^2V^{-1}s^{-1}$, and the ON/OFF current ratio thereof was a value of about 7 orders of magnitude.

Thus, with π-conjugated dendrons, the self-assembled structure was stabilized by a π-conjugate interaction between the dendrons, and the mobility was considerably improved, resulting in characteristics as high as those of a low-temperature p-Si device.

COMPARATIVE EXAMPLE 5

An FET of Comparative Example 5 similar to that of Example 5 was produced, except that the organic semiconductor layer 36 was formed by using oligothiophene, which is a conventional conductive macromolecule. The structure of the FET is the same as that of the FET 30 illustrated in FIG. 6.

The carrier mobility of the obtained FET was $8.5 \times 10^{-5}$ $cm^2 V^{-1} s^{-1}$, and the ON/OFF current ratio thereof was a value of about 3 orders of magnitude.

As can be seen from the results above, the characteristics of an organic thin film FET were considerably improved by using various types of dendrimers for the organic semiconductor layer 36.

EXAMPLE 8

Figure 7:
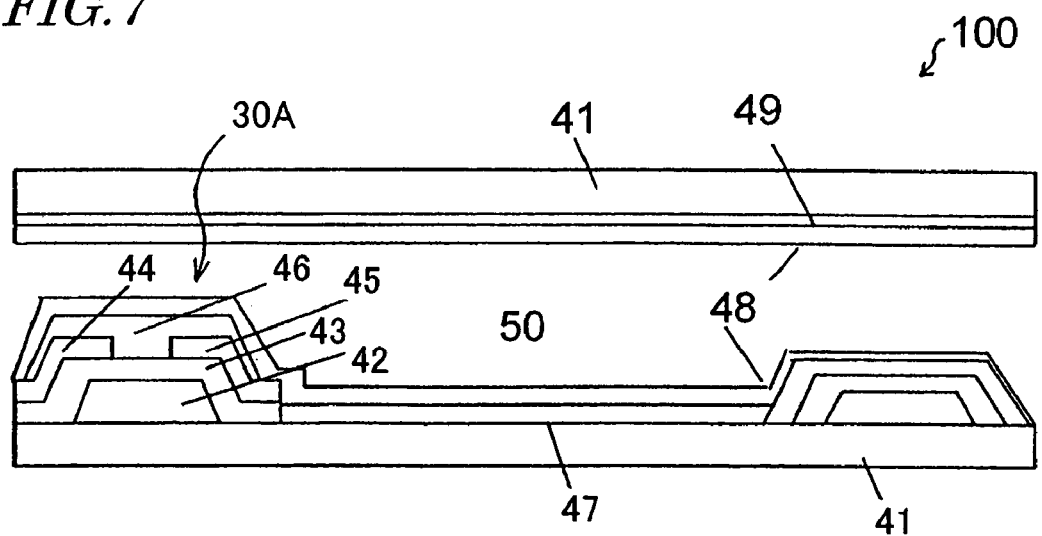
FIG. 7 is a schematic cross-sectional view illustrating a liquid crystal display apparatus 100 according to an embodiment of the present invention.

FIG. 7 is a schematic cross-sectional view illustrating a liquid crystal display apparatus 100 of the present example. The liquid crystal display apparatus 100 is a typical TN-mode TFT-type liquid crystal display apparatus. The liquid crystal display apparatus 100 has a known structure and can be produced by a known method, except that the FET 30 of Example 7 is used as a TFT 30A.

The FET 30A including a gate electrode 42, a gate insulating layer 43, a source electrode 44, a drain electrode 45 and an organic semiconductor layer 46 is formed on a glass substrate 41. A pixel electrode 47 formed by using ITO is connected to the drain electrode 45 of the FET 30A. A counter electrode 49 formed by using ITO is provided on another glass substrate 41 of the counter substrate. An alignment film 48 is provided entirely across one surface of each of the pair of substrates 41 that is closer to a liquid crystal layer 50. The liquid crystal molecules of the liquid crystal layer 50 are aligned by the alignment film 48 into a TN orientation. A nematic liquid crystal material with a positive dielectric anisotropy was used as the liquid crystal material, with a polyimide alignment film having a pretilt angle of about 2°.

The viewing angle characteristics of the liquid crystal display apparatus 100 were evaluated while driving the apparatus at 4 V, indicating that the angle (viewing angle) over which the contrast ratio was 10 or more was 80° or more for both the vertical and horizontal directions.

Thus, it was indicated that the FET 30A of the present invention can suitably be used as a TFT of a liquid crystal display apparatus. The application of the FET of the present invention is not limited to the liquid crystal display apparatus illustrated herein, but the FET can be used in various types of liquid crystal display apparatuses.

EXAMPLE 9

Figure 8:
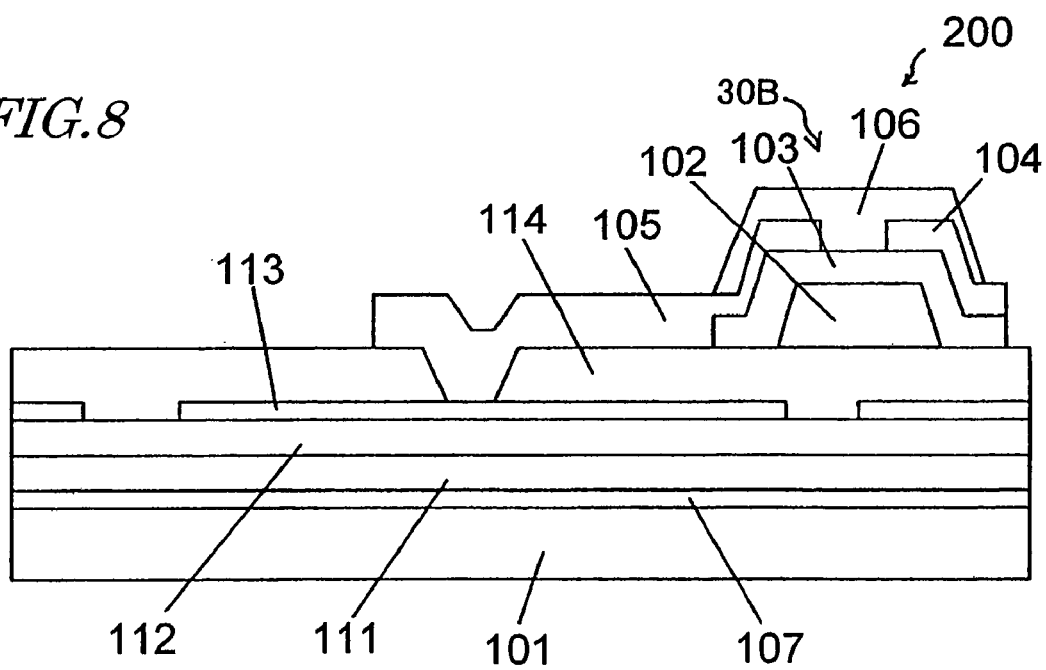
FIG. 8 is a schematic cross-sectional view illustrating an organic EL display apparatus 200 according to an embodiment of the present invention.

FIG. 8 is a schematic cross-sectional view illustrating an organic EL display apparatus 200 of the present example. The organic EL display apparatus 200 is a typical TFT-type organic EL display apparatus. The organic EL display apparatus 200 has a known structure and can be produced by a known method, except that the FET 30 of Example 7 is used as a TFT 30B.

In the organic EL display apparatus 200, an electric field light-emitting layer 111 and a hole-transporting layer 112, which are formed from organic thin films, are layered on an a transparent substrate 101, which is covered with a transparent electrode (ITO) 107. Pixel electrodes 113 are formed on the hole-transporting layer 112 while being separated from one another in a matrix pattern, and the FET 30B is provided over each pixel electrode 113 via a drain electrode 105 therebetween.

With the organic EL display apparatus 200, the light-emitting surface has a high aperture ratio because the light-emitting surface can be arranged without being dependent on the size of the FET 30B. Moreover, an interlayer insulating layer 114 functions as a flattening layer. Therefore, when producing a full-color display apparatus, the FETs 30B of the pixels can be arranged on a flat layer.

The organic EL display apparatus 200 exhibited a luminance of 7000 $Cd/m^2$ with a source voltage of 5 V and a gate voltage of 5 V. Moreover, it is capable of displaying a moving image.

Furthermore, a color display apparatus was produced by arranging red light-emitting layers, green light-emitting layers and blue light-emitting layers, as the electric field light-emitting layers 111, in a stripe pattern. The color display apparatus was driven with a source voltage of 5 V and a gate voltage of 5 V to display a moving image. The display was bright with a luminance of 3000 $Cd/m^2$, and the response speed was 0.5 msec.

Thus, it was indicated that the FET 30B of the present invention can suitably be used as a TFT of an organic EL display apparatus. The application of the FET of the present invention is not limited to the organic EL display apparatus illustrated herein, but the FET can be used in various types of organic EL display apparatuses.

Note that while the FET 30B of an inverted-staggered type is used in the examples above, a planar type FET may also be used.

The macromolecular structure of the present invention includes hyperbranched macromolecules, and has a self-assembled structure formed by a non-covalent interaction via the hyperbranched macromolecules, whereby it is possible to provide improved characteristics and reliability over a functional device using a conventional conductive macromolecule.

The functional device of the present invention can suitably be used in light-emitting devices, display devices, solar cells, photoelectric conversion devices, optical modulation devices, organic FET devices, condensers, rectification devices and various types of sensor devices.

Moreover, according to the present invention, it is possible to provide an organic transistor having improved characteristics and/or reliability over a transistor using a conventional conductive macromolecule. The transistor of the present invention can suitably be used as an active device of an active driving-type display apparatus, and it can be produced at a low cost while maintaining characteristics as high as those of a conventional a-Si TFT.

The invention claimed is:

1. A macromolecular structure, comprising a hole-conducting layer and an electron-conducting layer, wherein:
   the macromolecular structure comprises a first hyperbranched macromolecule and a second hyperbranched macromolecule;
   the first hyperbranched macromolecule, the second hyperbranched macromolecule, or both of the first hyperbranched macromolecule and the second hyperbranched macromolecule has either a hole conductivity or an electron conductivity;
   one of the hole-conducting layer and the electron-conducting layer includes the first hyperbranched macromolecule or the second hyperbranched macromolecule;

the macromolecular structure has a self-assembled structure formed by a non-covalent interaction via the first hyperbranched macromolecule or the second hyperbranched macromolecule; and the self-assembled structure is located in at least one of the hole-conducting layer, the electron-conducting layer, and an interface between the hole-conducting layer and the electron-conducting layer.

2. The macromolecular structure according to claim 1, wherein the first hyperbranched macromolecule has a hole conductivity, and the second hyperbranched macromolecule has an electron conductivity.

3. The macromolecular structure according to claim 2, wherein the hole-conducting layer includes a self-assembled structure formed by a plurality of first hyperbranched macromolecules, and the electron-conducting layer has a self-assembled structure formed by a plurality of second hyperbranched macromolecules.

4. The macromolecular structure according to claim 3, wherein the hole-conducting layer and the electron-conducting layer are layered on each other, and the macromolecular structure includes a self-assembled structure formed by a non-covalent interaction between the first hyperbranched macromolecule and the second hyperbranched macromolecule.

5. The macromolecular structure according to claim 3, wherein at least one of the hole-conducting layer and the electron-conducting layer has isotropic characteristics.

6. The macromolecular structure according to claim 1, wherein at least one of the first hyperbranched macromolecule and the second hyperbranched macromolecule is a dendrimer.

7. The macromolecular structure according to claim 1, wherein at least one of the first hyperbranched macromolecule and the second hyperbranched macromolecule has two or more different functions.

8. The macromolecular structure according to claim 1, further comprising a third hyperbranched macromolecule between the first hyperbranched macromolecule and the second hyperbranched macromolecule, wherein a self-assembled structure is formed by a non-covalent interaction between the third hyperbranched macromolecule and the first hyperbranched macromolecule or the second hyperbranched macro molecule.

9. The macromolecular structure according to claim 8, wherein the first hyperbranched macromolecule has a hole conductivity, the second hyperbranched macromolecule has an electron conductivity, and the third hyperbranched macromolecule has one of a hole conductivity, an electron conductivity and an ion conductivity.

10. The macromolecular structure according to claim 9, wherein the hole-conducting layer includes a self-assembled structure formed by a plurality of first hyperbranched macromolecules, the electron-conducting layer includes a self-assembled structure formed by a plurality of second hyperbranched macromolecules, and the macromolecular structure comprises a further functional layer including a self-assembled structure formed by a plurality of third hyperbranched macromolecules between the hole-conducting layer and the electron-conducting layer.

11. The macromolecular structure according to claim 10, wherein the hole-conducting layer, the electron-conducting layer and the further functional layer are layered on one another, and the macromolecular structure includes at least one of a self-assembled structure formed by a non-covalent interaction between the first hyperbranched macromolecule and the third hyperbranched macromolecule and a self-assembled structure formed by a non-covalent interaction between the second hyperbranched macromolecule and the third hyperbranched macromolecule.

12. The macromolecular structure according to claim 10, wherein at least one of the hole-conducting layer, the electron-conducting layer and the further functional layer has isotropic characteristics.

13. The macromolecular structure according to claim 8, wherein at least one of the first hyperbranched macromolecule, the second hyperbranched macromolecule and the third hyperbranched macromolecule is a dendrimer.

14. The macromolecular structure according to claim 8, wherein at least one of the first hyperbranched macromolecule, the second hyperbranched macromolecule and the third hyperbranched macromolecule has two or more different functions.

15. A functional device, comprising the macromolecular structure according to claim 1, and an electrode electrically connected to the macromolecular structure.

16. A transistor, comprising a first electrode, a second electrode, a semiconductor layer provided between the first electrode and the second electrode, and a third electrode for applying an electric field across the semiconductor layer, wherein the semiconductor layer includes a hyperbranched macromolecule and has a self-assembled structure formed by a non-covalent interaction via the hyperbranched macro molecule.

17. The transistor according to claim 16, wherein the semiconductor layer has an isotropic conductivity.

18. The transistor according to claim 16, wherein the hyperbranched macromolecule has a spherical stereostructure.

19. The transistor according to claim 16, wherein the hyperbranched macromolecule has a disc-shaped stereostructure.

20. The transistor according to claim 16, wherein the hyperbranched macromolecule is a dendrimer.

21. The transistor according to claim 16, wherein the transistor is a field effect transistor that utilizes an electric field effect of the semiconductor layer in response to an electric field applied by the third electrode.

22. A display apparatus, comprising a plurality of pixels and a plurality of active devices corresponding respectively to the plurality of pixels, wherein each of the plurality of active devices is the transistor according to claim 21.

* * * * *